United States Patent [19]
Wakino et al.

[11] Patent Number: 5,184,096
[45] Date of Patent: * Feb. 2, 1993

[54] PARALLEL CONNECTION MULTI-STAGE BAND-PASS FILTER COMPRISING RESONATORS WITH IMPEDANCE MATCHING MEANS CAPACITIVELY COUPLED TO INPUT AND OUTPUT TERMINALS

[75] Inventors: Kikuo Wakino; Toshio Hishikawa; Youhei Ishikawa; Koichi Takehara; Toru Tanizaki, all of Nagaokakyo, Japan

[73] Assignee: Murata Manufacturing Co., Ltd., Japan

[*] Notice: The portion of the term of this patent subsequent to Mar. 17, 2009 has been disclaimed.

[21] Appl. No.: 750,614

[22] Filed: Aug. 27, 1991

Related U.S. Application Data

[62] Division of Ser. No. 517,248, May 1, 1990, Pat. No. 5,097,236.

[30] Foreign Application Priority Data

May 2, 1989 [JP] Japan .................................. 1-113927
Apr. 19, 1990 [JP] Japan .................................. 2-103961

[51] Int. Cl.⁵ ...................... H03H 7/00; H01P 1/201
[52] U.S. Cl. .................................. 333/175; 333/202; 333/204; 333/206
[58] Field of Search ............... 333/126, 132, 124, 167, 333/168, 174–181, 202, 204, 206, 134, 219

[56] References Cited

U.S. PATENT DOCUMENTS

| | | | |
|---|---|---|---|
| 2,682,037 | 6/1954 | Bobis et al. | 333/175 |
| 2,709,206 | 5/1955 | Ferguson | 330/84 |
| 3,551,855 | 12/1970 | Seidel | 333/35 X |
| 4,477,785 | 10/1984 | Atia | 333/202 |

FOREIGN PATENT DOCUMENTS

| | | | |
|---|---|---|---|
| 0097404 | 5/1987 | Japan | 333/202 |
| 0267001 | 11/1988 | Japan | 333/204 |

Primary Examiner—Eugene R. LaRoche
Assistant Examiner—Seung Ham
Attorney, Agent, or Firm—Ostrolenk, Faber, Gerb & Soffen

[57] ABSTRACT

A parallel connection multi-stage band-pass filter including an input terminal and an output terminal for signals, a plurality of resonators respectively having resonator frequencies different from and close to one another which are electrically connected in parallel to each other between said input and output terminals.

9 Claims, 17 Drawing Sheets

Fig. 9

| | Series multi-stage coupled filter | Parallel multi-stage coupled filter |
|---|---|---|
| Frequency component | n pcs. of resonance modes formed by n pcs. of resonators share respective frequencies | n pcs. of resonators share respective frequencies |
| Group delay characteristic |  |  |
| Degrees of freedom of electrical characteristic | 7 = 3 (No. of resonance frequency) + 4 (No. of couplings) (at n = 3) | 9 = 3 (No. of resonance frequency) + 6 (No. of couplings) (at n = 3) |

PARALLEL CONNECTION MULTI-STAGE BAND-PASS FILTER COMPRISING RESONATORS WITH IMPEDANCE MATCHING MEANS CAPACITIVELY COUPLED TO INPUT AND OUTPUT TERMINALS

This is a division of application Ser. No. 07/517,248, filed May 1, 1990, now U.S. Pat. No. 5,097,236, issued Mar. 17, 1992.

BACKGROUND OF THE INVENTION

The present invention generally relates to an electrical filter, and more particularly, to a parallel connection multi-stage band-pass filter suitable for use as a channel filter of a radio frequency signal combining/sorting device for a mobile unit communication system such as an automobile telephone or the like, or as a transmission/receiving filter for mobile equipment, etc.

A recent trend in mobile unit communication systems such as automobile telephones and the like, has been to employ a so-called cellular system. Because of the rapid increase in the number of users, a reduction in the cell radius and an increase in the number of base stations employed has been concurrently required. In accordance with this trend, features such as compact size, low loss, and cost reduction are required in the radio frequency signal combining/sorting device employed in base stations.

As shown in FIG. 16, a conventional radio frequency signal combining/sorting device to be used for the base station of the cellular system, includes a plurality of sets of isolators 1 and channel filters 2, a power composition network 3 for interconnecting these sets of isolators 1 and channel filters 2, an antenna monitor 4, and one antenna filter 5 coupled to each other as shown.

In a conventional radio frequency signal combining/sorting device of the above described type, each channel filter 2 is constituted by a band-pass filters (abbreviated as BPF) which allows signals of a specific frequency band corresponding to a respective channel to pass therethrough.

The conventional band-pass filter of the above described type is designed as described hereinbelow to realize a filter for actual applications.

Referring to FIG. 17, the circuit for the band-pass filter as described above is obtained by subjecting a low-pass filter (abbreviated as LPF) for which a generally known designing theory exists, to circuit conversion by a conversion formula called an inverter. The band-pass filter circuit thus obtained by such circuit conversion consists of a series connection multi-stage band-pass filter circuit 8 in which a plurality of neighboring LC resonance circuits 7 are sequentially subjected to mutual inductive coupling as shown in FIG. 17.

The series connection multi-stage band-pass filter circuit 8 of FIG. 17 as referred to above is the so-called design circuit for designing the band-pass filter, and is characterized in that it is readily realized in a microwave band region.

For realizing the series connection multi-stage band-pass filter circuit 8 which is the design circuit obtained in the above described manner as an actual filter, the respective LC resonance circuits 7 in three stages, connected in series to each other as in FIG. 17, are replaced or approximated by actual resonators, for example, $TE_{01\delta}$ dielectric resonators. Accordingly, a series connection multi-stage band-pass filter including a plurality of dielectric resonators and having predetermined frequency characteristics can be realized.

One example of the series connection multi-stage band-pass filter 11 thus realized is illustrated in FIG. 18, with its equivalent circuit shown in FIG. 19.

The series connection multi-stage band-pass filter 11 referred to above is the same filter proposed by the present inventors in "Dielectric high-power band-pass filter using quarter-cut $TE_{01\delta}$ image resonator for cellular stations," IEEE transactions on Microwave Theory and Techniques, MTT, Vol. 35, No. 12, pp. 1150-55, December 1987. As shown in FIG. 18, each series connection muti-stage BPF 11 includes a plurality of arcuate dielectric resonators 12 referred to by the present inventors as "quartercut $TE_{01\delta}$ image resonators" having been formed from a ¼ portion of the $TE_{01\delta}$ mode dielectric resonator which was originally in an annular shape. Ceramic substrates 14 formed with electrode films on surfaces 13 thereof are disposed in an L-shape to act as an electric wall. The arcuate dielectric resonators 12 are fixed to the ceramic substrates 14 at predetermined intervals. The ceramic substrates 14 and dielectric resonators 12 function as $TE_{01\delta}$ mode image resonators. The ceramic substrates 14 referred to above are electrically and mechanically fixed onto walls of a metallic housing 15, whereby the interior of housing 15 is formed to have the construction equivalent of a $TE_{01\delta}$ mode circular cut-off type waveguide divided into ¼. Each of the dielectric resonators 12 in FIG. 18 is inductively coupled to another, with the dielectric resonators 12 at the ends of the series circuit inductively coupled with external loads.

The series connection multi-stage band-pass filter 11 as described above may be made much smaller in size as compared with a filter employing an ordinary cavity resonator because series-coupled resonators of this kind are generally arranged such that respective natural vibration modes take care of the respective frequency components. However, with dielectric resonators 12 connected in series, energy distribution will differ among the dielectric resonators 12 at respective stages.

FIG. 7 shows one example of band-pass characteristic and group delay characteristic obtained by a conventional three stage series connection multi-stage band-pass filter.

As is seen from the group delay characteristic in FIG. 7, it is difficult to realize a flat group delay characteristic over the entire band-pass region using a series connection multi-stage BPF, because respective frequency components share the same respective natural vibration modes, and external coupling degrees for all natural vibration modes are correlatively altered even when parameters for the resonators are adjusted, and thus, a flat group delay characteristic at each respective resonance frequency cannot be set as desired.

Moreover, the group delay characteristic of the series connection multi-stage band-pass filter is characterized in that it has peak values at the extreme ends of the band-pass region. In order to obtain a flat group delay characteristic over the entire working band region, the design region must be broadened so that the peaks at the extreme ends are located outside the working band region, thereby making it difficult to realize band-pass characteristics with sufficiently superior selectivity.

Furthermore, the group delay characteristic as described above cannot fully handle the digitized transmission signals employed in the rapidly advancing technology of today. Therefore, the realization of filters having a flat group delay characteristic is in great demand.

Incidentally, the filter 11 realized in the manner described above is only an approximation of a band-pass filter, derived from the design theory of a low-pass filter, employing a $TE_{01\delta}$ mode dielectric resonator 12, and it does not have the electrical characteristics which fully agree with the design characteristics possessed by the design circuit referred to earlier.

Therefore, Zuiho KYO et al. have proposed a parallel-coupled circuit simulation model utilizing an inherent mode developing method for simulating the actual series-coupled filter described above, on pages 9 to 16 of a paper entitled "Composition of microwave circuit by inherent mode developing method," Electronic Communication Institute, Microwave Research Meeting Data, MW82-54, 1982. The parallel-coupled circuit simulation model has a circuit construction as shown in FIG. 20 and is intended to allow simulations incorporating factors such as the asymmetrical nature of attenuation and the spurious modes in a microwave filter. In a case where a series connection multi-stage band-pass filter has natural vibration modes of m pieces, this model assumes that when the respective variation modes are realized, for example, by continuous resonators comprised of $n=3$ pieces, the natural vibration modes of m pieces are obtained by multi-stage resonators of $(m \times n)$ pieces. It should be noted that when the relation is $n=3$, for example, the mutual coupling of the three resonators connected by series coupling reduces the number of degrees of freedom of the respective natural vibration modes to 7, whereas the degrees of freedom of the electrical characteristics derived from the assumption that each resonator is independent and parallely coupled, as is done is the above model, would be 9.

Although the above simulation model is extremely useful for theoretical analysis of the natural vibration modes of a series connection multi-stage band-pass filter, this model cannot be used as described above for actual filters.

SUMMARY OF THE INVENTION

Accordingly, an essential object of the present invention is to provide a multi-stage band-pass filter which is capable of realizing a flat group delay characteristics over an entire pass band region.

Another object of the present invention is to provide a multi-stage band-pass of the above described type with which necessary electrical characteristics can be readily obtained.

A further object of the present invention is to provide a multi-stage band-pass filter of the above described type in which the electrical characteristic of each resonator independently contributes to the electrical characteristic of the filter as a whole.

The present inventors regard part of the above simulation circuit, e.g., a reference vibration mode portion, as a new filter circuit, and in order to realize the design circuit, the parallel connection multi-stage band-pass filter is formed by replacing the respective LC resonance circuits of the above simulation circuit with actual resonators, e.g., $TE_{01}$ mode dielectric or transmission line resonators. The inventors thus found that said parallel connection multi-stage band-pass filter can readily flatten the group delay characteristics in a specific pass-band region.

In accomplishing these and other objects, according to preferred embodiments of the present invention, there are provided parallel connection multi-stage band-pass filters having features as stated hereinbelow.

In a first aspect of the present invention, there is provided a parallel connection multi-stage band-pass filter which includes an input terminal and an output terminal for signals, and a plurality of resonators respectively having resonance frequencies different from and close to each other, and said plurality of resonators are electrically connected in parallel between said input and output terminals.

In a second aspect of the present invention, the parallel connection multi-stage band-pass filter includes an input terminal and an output terminal for signals, and plurality of resonators each provided with first and second ports and having frequencies different from and close to each other. Said first port of each of said resonators is electrically connected to said input terminal through a first impedance matching means, and said second port of each of said resonators is electrically connected to said output terminal through a second impedance matching means.

In a third aspect of the present invention, in the parallel connection multi-stage band-pass filter described above, the first port of each of said resonators is electrically connected to said input terminal through said first impedance matching means by inductive coupling, with the second port of each of said resonators being electrically connected to said output terminal through said second impedance matching means by inductive coupling.

In a fourth aspect of the present invention, in the parallel connection multi-stage band-pass filter described above, the first port of each of said resonators is electrically connected to said input terminal through said first impedance matching means by capacitive coupling, with the second port of each of said resonators being electrically connected to said output terminal through said second impedance matching means by capacitive coupling.

In a fifth aspect of the present invention, in the parallel connection multi-stage band-pass filter described above, the respective resonators are comprised of dielectric resonators.

In a sixth aspect of the present invention, in the parallel connection multi-stage band-pass filter described above, the respective resonators are comprised of transmission line type resonators.

In a seventh aspect of the present invention, in the parallel connection multi-stage band-pass filter described above, said transmission line type resonators are comprised of either coaxial dielectric resonators or micro-strip lines.

In an eighth aspect of the present invention, in the parallel connection multi-stage band-pass filter described above, the resonators that respectively have the maximum and minimum resonance frequencies have approximately the same first loaded Q, and another resonator with an intermediate frequency has a loaded Q that is approximately the same as or smaller than said first loaded Q.

In a ninth aspect of the present invention, in the parallel connection multi-stage band-pass filter described above, said loaded Q of each of said resonators is set such that the amount of variation of a positive direction transfer function of said band-pass filter operating within a predetermined pass-band region becomes small when a non-loaded Q of each of said resonators is finite.

In a tenth aspect of the present invention, in the parallel connection multi-stage band-pass filter described above, said loaded Q of each of said resonators is set such that respective amounts of variation, at a plurality of variation points, produced in the frequency characteristic of the group delay time associated with a predetermined pass-band region of said band-pass filter, become approximately equal to each other.

In an eleventh aspect of the present invention, in the parallel connection multi-stage band-pass filter described above, said loaded Q of each of said resonators is set such that respective amounts of variation at a plurality of variation points produced in the frequency characteristic of the group delay time associated with a predetermined pass-band region of said band-pass filter become approximately zero.

In a twelfth aspect of the present invention, in the parallel connection multi-stage band-pass filter described above, the phases of said signals at the respective resonance frequencies of the respective signals passing through said resonators having neighboring resonance frequencies different from and close to each other are inverted with respect to each other.

An advantage of the parallel connection multi-stage band-pass filter of the above first aspect is that the parallely coupled individual resonators independently contribute to the electrical characteristic of the band-pass filter. In other words, n pieces of resonators constituting the band-pass filter can each handle their respective corresponding frequency regions so that a frequency characteristic characterized by a flat positive direction transfer function and a flat group delay time can be obtained (FIG. 5).

In the second aspect of the present invention, the respective resonators are electrically connected in parallel between the input and output terminals for the signals respectively through said first and second impedance matching means. In addition to the favorable frequency characteristic previously referred to, this arrangement allows the input and output signal at the respective input and output ends to enter or come out of said band-pass filter in an impedance matched state.

Moreover, in the band-pass filter of the above second aspect, the first port of each of the resonators is electrically connected to said input end through a first impedance matching means by inductive or capacitive coupling, while the second port of each resonator is electrically connected to said output end through a second impedance matching means by inductive or capacitive coupling.

Further, in the above parallel connection multi-stage band-pass filter, the respective resonators are preferably dielectric resonators or transmission line type resonators, the latter being comprised of either coaxial dielectric resonators or micro-strip lines.

By the arrangement of said loaded Q in the above eighth aspect, a frequency characteristic for a flatter positive direction transfer function and group delay time may be obtained.

By setting the loaded Q of each resonator so that the amount of variation of the positive direction transfer function associated with a predetermined pass-band region of said band-pass filter becomes small when the non-loaded Q of the resonator is infinite, an extremely flat frequency characteristic of the positive direction transfer function may be obtained. Moreover, by setting the loaded Q of each resonator so that the respective variation amounts at a plurality of variation points produced in the frequency characteristic of the group delay time associated with a predetermined pass-band region become approximately equal to each other, an even flatter and more advantageous frequency characteristic of group delay time can be obtained. Additionally, by setting the loaded Q of each resonator so that such variation amounts as referred to above become approximately zero, an extremely flat frequency characteristic of the group delay time can be achieved.

In accordance with the arrangement for phase inversion as in the above ninth aspect of the present invention operating at a frequency in the vicinity of an intermediate frequency of said two neighboring frequencies, the formation of an attenuation pole in the frequency characteristic of the positive direction transfer function may be prevented.

According to the present invention, since a plurality of resonators having resonance frequencies different from and close to each other are electrically connected in parallel between the input and the output terminals, and a respective frequency component of a signal is electrically distributed to each resonator, the energy distribution applied to each resonator becomes uniform. Thus, by adjusting the electrical characteristics of the respective resonators, the frequency characteristics for a flat positive direction transfer function and a flat group delay characteristic may be obtained.

Moreover, since the respective resonators are electrically connected in parallel between the input and output terminals respectively through said first and second impedance matching means, the frequency characteristics of the flat positive direction transfer function and the flat group delay time are obtained with the input and output signals at the input and output terminals in an impedance matched state with respect to the BPF.

Furthermore, by arranging the above parallel connection multi-stage band-pass filter so that of said resonators, the resonators respectively having the maximum and minimum resonance frequencies have approximately the same first loaded Q, with another resonator having an intermediate frequency having a loaded Q approximately the same as or smaller than said first loaded Q, a still flatter positive direction transfer function and a flatter group delay characteristic may be advantageously achieved.

In addition, by the arrangement in which the phases in the respective resonance frequencies of the respective signals passing through said resonators having neighboring resonance frequencies are inverted with respect to each other, it becomes possible to prevent the formation of an attenuation pole at a frequency in the vicinity of the intermediate frequency of the two neighboring resonance frequencies in the frequency characteristic of the positive direction transfer function.

BRIEF DESCRIPTION OF THE DRAWINGS

These and other objects and features of the present invention will become apparent from the following description of preferred embodiments thereof, with reference to the accompanying drawings, in which:

FIG. 9 is a chart illustrating a comparison between the parallel connection multi-stage band-pass filter according to the present invention and the conventional series connection multi-stage band-pass filter;

DETAILED DESCRIPTION OF EMBODIMENTS OF THE INVENTION

Figure 1:
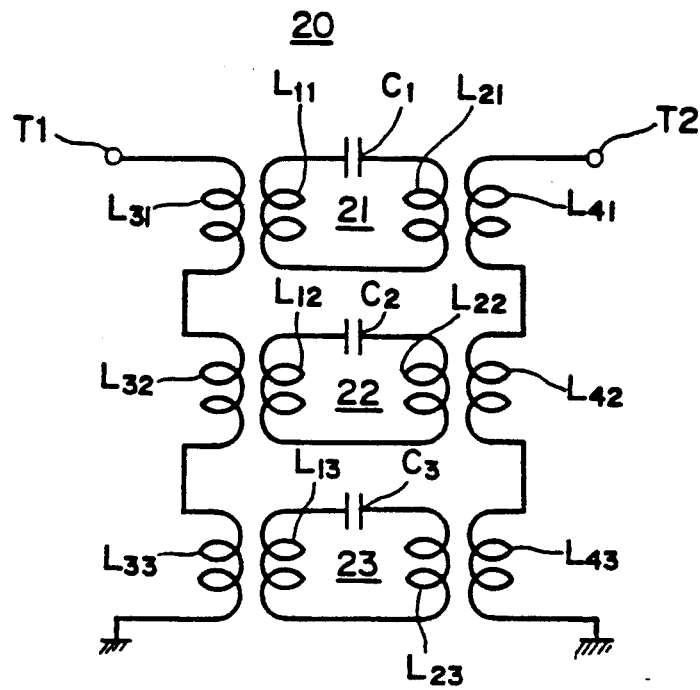
FIG. 1 is a circuit diagram showing a fundamental equivalent circuit for an inductively-coupled type parallel connection multi-stage band-pass filter according to a first embodiment of the present invention.

Before the description of the present invention proceeds, it is to be noted that like parts are designated by like reference numerals throughout the accompanying drawings.

Referring now to the drawings, embodiments according to the present invention will be described hereinafter.

A parallel connection multi-stage band-pass filter according to a first aspect of the present invention is characterized in that it includes an input terminal or input end and an output terminal or output end for signals, and a plurality of resonators respectively having resonance frequencies different from and close to each other, which are electrically connected in parallel with each other between said input and output terminals.

In the above band-pass filter, according to a first embodiment of the invention, said plurality of resonators are connected between the input and output terminals by inductive coupling, whereas according to a second embodiment, said resonators are connected to said input and output terminals via capacitive coupling.

First Embodiment

FIG. 1 shows a fundamental equivalent circuit construction 20 of an inductively-coupled type parallel connection multi-stage band-pass filter according to a first embodiment of the present invention.

In FIG. 1, an input terminal or input end T1 for a signal is connected to ground through three inductors or coils L31, L32, L33 connected in series to each other, while an output terminal or output end T2 for said signal is also connected to ground via three series-connected inductors L41, L42 and L43 as shown. Numerals 21, 22 and 23 represent series resonance circuits for the resonators. The circuit 21 includes two series-connected inductors L11 and L21 and a capacitor C1, circuit 22 is constituted by two series-connected inductors L12 and L22 and a capacitor C2, and circuit 23 includes two series-connected inductors L13 and L23 and a capacitor C3.

Inductors L31 and L11, inductors L32 and L12, and inductors L33 and L13 are respectively electrically connected by inductive coupling. Similarly, inductors L21 and L41, inductors L22 and L42, and inductors L23 and L43 are respectively electrically connected by inductive coupling.

Moreover, the series resonance circuits 21,22 and 23 are arranged to have resonant frequencies different from, but close to each other, and the respective resonance circuits 21, 22 and 23 constitute band-pass filters having the above resonance frequencies as center frequencies for their pass-bands. Accordingly, the parallel connection multi-stage band-pass filter shown in FIG. 1 has a pass-band in which the pass-bands of the above series connection resonance circuits 21, 22 and 23 are built one upon another.

Figure 2A:
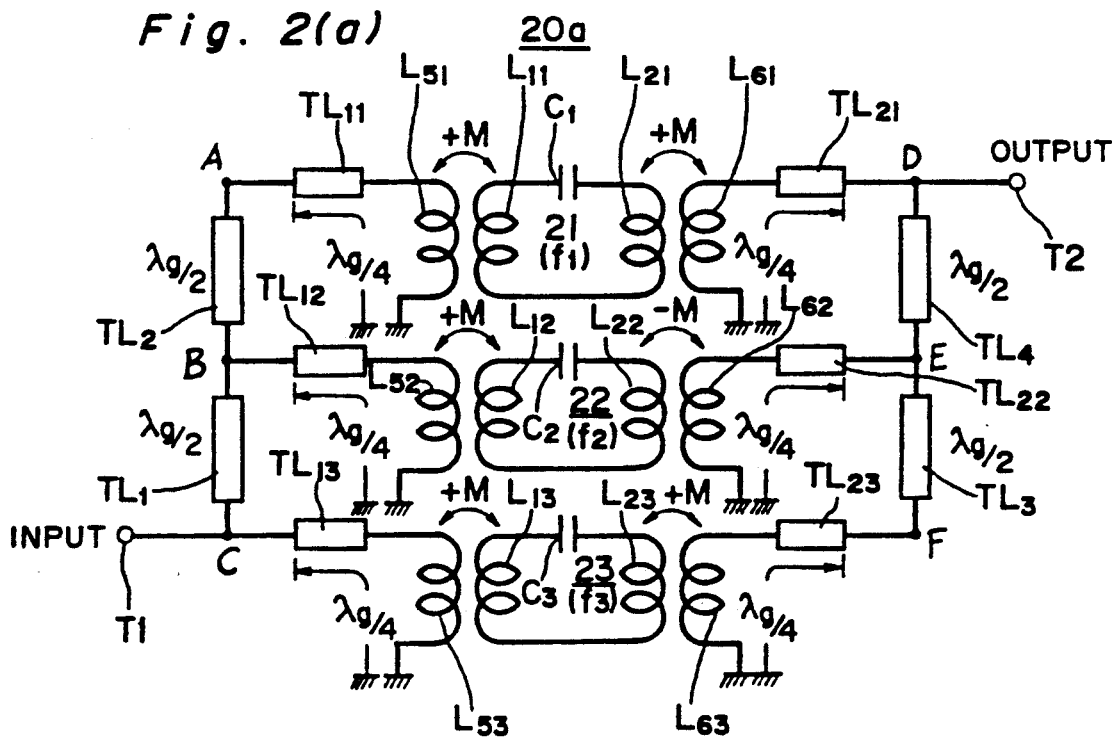
FIGS. 2(a) and 2(b) are equivalent circuit diagrams showing modifications of the first embodiment, as examples of band-pass filters in which the fundamental circuit of FIG. 1 is realized in a microwave band region.

FIG. 2(a) shows a band-pass filter 20a in which the fundamental equivalent circuit 20 of FIG. 1 is realized in a microwave band region. In FIG. 2(a), like parts in FIG. 1 are designated by like reference numerals for brevity of explanation.

In the circuit of FIG. 2(a), the series resonance circuits 21, 22 and 23 are constructed in a similar manner as in FIG. 1, respectively having resonance frequencies f1,f2,f3 such that f1<f2<f3.

Input T1 for a signal is connected to ground through two paths. The first is comprised of transmission lines TL1 and TL2 each having an electrical length of λg/2, a transmission line TL11 having a predetermined electrical length, and an inductor L51. The second is comprised of a transmission line TL13 having a predetermined electrical length and an inductor L53. A junction B between the transmission lines TL1 and TL2 is connected to ground through another transmission line TL12 having a predetermined electrical length and an inductor L52. In the above arrangement, an electrical length from a connecting point A at the side of line TL2 contacting line TL11 to the ground shortcircuiting point through inductor L51 is set at λg/4, an electrical length from the connecting point B at the side of line TL1 contacting line TL12 to the ground shortcircuiting point through inductor L52 is set at λg/4, and an electrical length from a connecting point C at the side of the input T1 contacting line TL13 to the ground shortcircuiting point through the inductor L53 is set at λg/4. It is to be noted here that λg represents a propagation wavelength on the transmission line, e.g., at the frequency f2 which is the center frequency of this band-pass filter.

On the other hand, the signal output T2 is connected to ground through a transmission line TL21 having a predetermined electrical length and an inductor L61, and is also connected to ground through transmission lines TL4 and TL3 respectively having electrical length of λg/2, a transmission line TL23 having a predetermined electrical length, and an inductor L63. A junction E between the transmission lines TL3 and TL4 is connected to ground through another transmission line TL22 having a predetermined electrical length and an inductor L62. In the above arrangement, an electrical length from a connecting point D at the side of the output line T2 contacting line TL21 to the ground shortcircuiting point through inductor L61 is set at λg/4, an electrical length from the connecting E point at the side of line TL4 contacting line TL22 to the ground shortcircuiting point through inductor L62 is set at λg/4, and an electrical length from a connecting point F at the side of the line TL3 contacting line TL23 to the ground shortcircuiting point through inductor L63 is set at λg/4.

The above pairs of inductors L11 and L51, L12 and L52, and L13 and L53, are electrically connected to each other through inductive coupling with an inductive coupling factor +M. Inductors L21 and L61 and L23 and L63 are similarly electrically connected to each other through inductive coupling with an inductive coupling factor +M, and the inductors L22 and L62 have an induction coupling factor −M.

In the parallel connection multi-stage band-pass filter having the construction as described so far, at the input T1 thereof, the respective impedances of the ground shortcircuiting points as viewed from the connecting point A at the transmission line TL2 side of transmission line TL11 through inductor L51, from B at the transmission line TL1 side of transmission line TL12 through inductor L52, and from C at the input T1 side of transmission line TL13 through inductor L53 are respectively set to become infinite, while inductors L51, L52 and L53 which function as impedance matching means are connected in parallel to the input T1 through transmission lines TL1, TL2, TL11, TL12 and TL13.

Meanwhile, at the output T2, the respective impedances of the ground shortcircuiting points as viewed from the connecting point D at the output T2 side of transmission line TL21 through inductor L61, from E at the transmission line TL4 side of transmission line TL22 through inductor L62, and from F at the transmission line TL3 side of transmission line TL23 through inductor L63 are respectively set to become infinite, while inductors L61, L62 and L63 which function as impedance matching means are connected in parallel to the output T2 through transmission lines TL3, TL4, TL21, TL22 and TL23.

Accordingly, the series connection resonance circuits 21, 22 and 23 are respectively connected in parallel between the signal input T1 and output T2 through the impedance matching means referred to above.

When a microwave signal is applied to the input T1 of the parallel connection multi-stage band-pass filter 20a constructed as above, said microwave signal is distributed to pass through the respective resonant circuits 21, 22, and 23, and is thereafter composed to be output from the output T2. It is to be noted here that the signal passing through the resonance circuit 21 is a component of the signal input at T1 characterized by a resonance frequency f1 or thereabout. Likewise, the signal passing through the resonance circuit 22 is a signal component characterized by a resonance frequency f2 or thereabout, and the signal passing through the resonance circuit 23 is a signal component characterized by a resonance frequency f3 or thereabout. Accordingly, the positive direction transfer function between the input and output ends T1 and T2 will be composed of the overlapped or superposed frequency characteristics of the positive direction transfer functions for each of the resonance circuits 21, 22, and 23, respectively.

In the above band-pass filter 20a as shown in FIG. 2(a), the induction coupling factor between the inductors L22 and L62 is set to be −M, while that between the other inductors L21 and L61 and L23 and L63, respectively, is set to be +M. More specifically, the phase of the signal passing through the resonance circuit 22 characterized by a resonance frequency f2 located at an intermediate spectral portion between the other two resonance frequencies f1 and f3 is inverted with respect to the phases of the signal components passing through resonance circuits 21 and 23, all of those signals being composed at the output T2.

The above arrangement is made for the following reason. If the above inversion is not effected, then at a frequency f12 which is generally midway between the resonance frequencies f1 and f2, the relation between the phase $\theta 21$ of the signal passing through the resonant circuit 21 and the phase $\theta 22$ of the signal passing through the resonance circuit 22 becomes an inverted relation as in, for example, $\theta 21 = -\theta 22$. Similarly, at the frequency f23 generally midway between the resonance frequencies f2 and f3, the relation between the phase of the signal passing through the resonant circuit 22 and the phase of the signal passing through the resonance circuit 23 becomes an inverted relation, whereby attenuation poles are formed at the frequencies f12 and f23 of the frequency characteristic of the positive direction transfer function in said band-pass filter, and thus, said frequency characteristic does not flatten. Therefore, in accordance with an aspect of the present invention, the signs of the induction coupling factor are inverted for the respective neighboring frequencies as described above.

It should be noted here that, according to the present embodiment, although the signs of the induction coupling factor are inverted for the respective adjacent frequencies as described above, the concept of the present invention is not limited to the above, but it may also be modified, for example, by adjusting the electrical length of the transmission line so that the phases of the respective signals passing through the resonance circuits characterized by neighboring resonance frequencies at their respective resonance frequencies are in an inverted relation to each other. A similar modification may be possible even when the resonance circuits are generally provided in a plurality of n stages.

Moreover, the reason why the input T1 is provided at the connecting point C between the transmission lines TL1 and TL13, instead of the connecting point A between the lines TL2 and TL11 or point B between the lines TL1 and TL2, is to make the transmission loss of the respective signals passing through the resonant circuits 21, 22 and 23 generally constant.

Figure 3A:
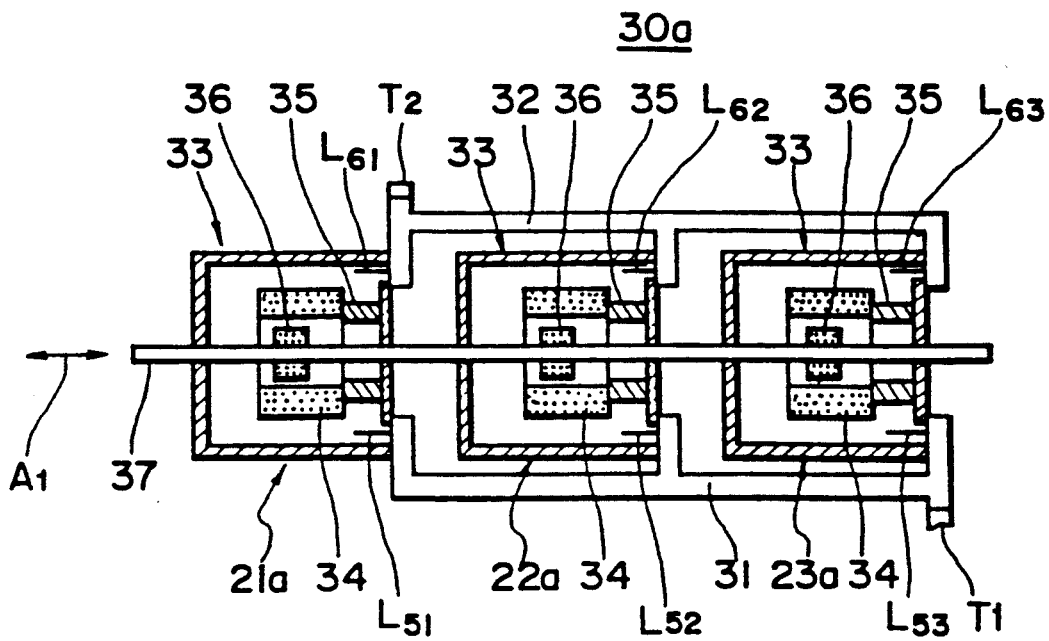
FIGS. 3(a) and 3(b) are sectional diagrams showing examples of parallel connection multi-stage band-pass filters in which the resonators in FIGS. 2(a) and 2(b) are comprised of $TE_{01\delta}$ mode dielectric resonators.
Figure 4A:
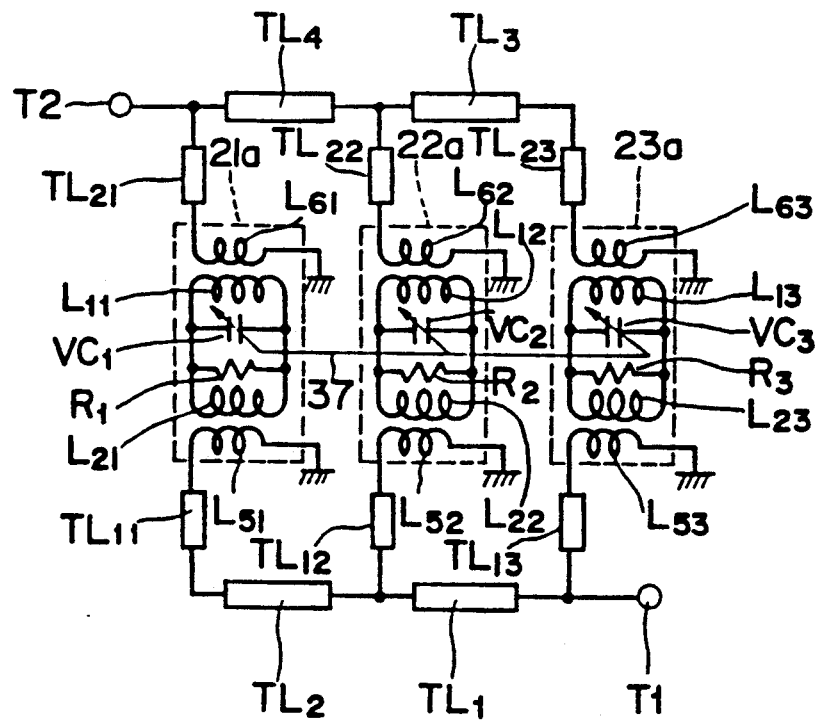
FIGS. 4(a) and 4(b) are circuit diagrams showing equivalent circuits for the parallel connection multi-stage band-pass filters of FIGS. 3(a) and 3(b)

FIG. 3(a) shows the parallel connection multi-stage band-pass filter 30a in which the resonators in FIG. 2(a) are replaced by $TE_{01\delta}$ mode dielectric resonators 21a, 22a and 23a, respectively, while FIG. 4(a) gives an equivalent circuit of said band-pass filter 30a. In FIGS. 3(a) and 4(a), like parts in FIG. 2(a) are designated by like reference numerals.

Figure 16:
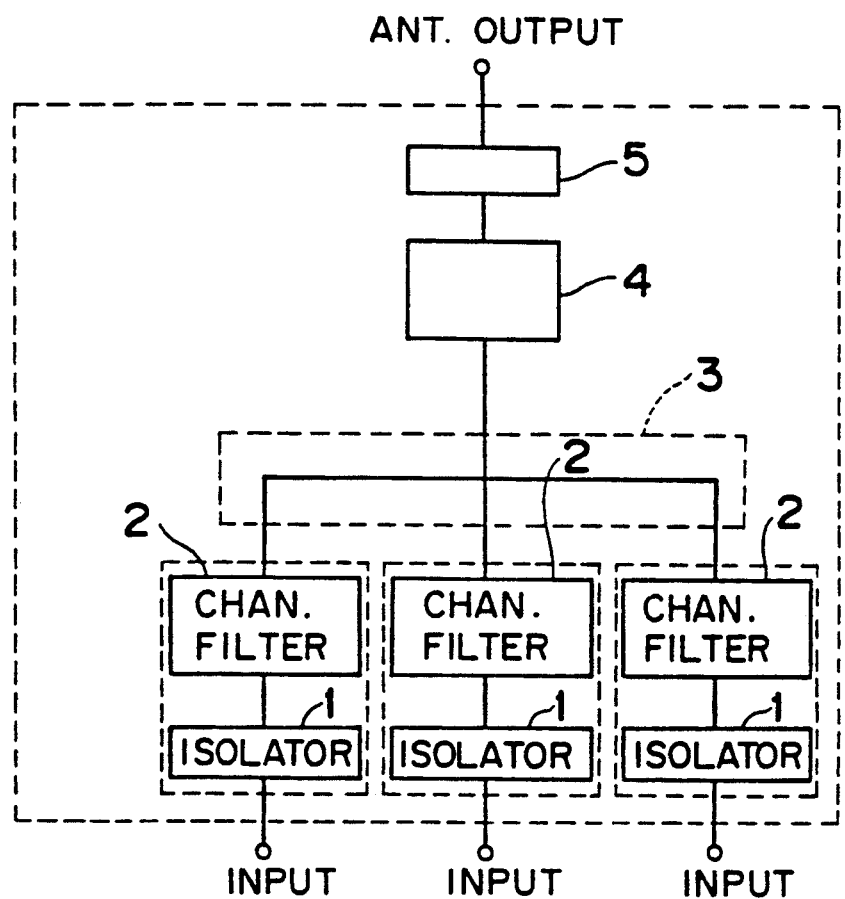
FIG. 16 is a block diagram of a conventional radio frequency signal combining/sorting device used in a base station of a cellular system.

The parallel connection multi-stage band-pass filter 30a in FIG. 3(a) thus obtained is the type of filter used as in FIG. 16 for the channel filter 2. It is incorporated in the radio frequency signal combining/sorting device employed in the base station of the cellular system described earlier with reference to FIG. 16.

The parallel connection multi-stage band-pass filter 30a in FIG. 3(a) constituting the above channel filter 2 includes three dielectric resonators 21a, 22a and 23a, which are respectively connected in parallel between input T1 and output T2 by an input coaxial cable 31 and output coaxial cable 32. The input coaxial cable 31 corresponds to transmission lines TL1, TL2, TL11, TL12 and TL13 described above, while the output coaxial cable 32 corresponds to the transmission lines TL3, TL4, TL21, TL22 and TL23 described above.

Each of said dielectric resonators 21a, 22a and 23a is constituted by attaching a $TE_{01\delta}$ mode dielectric resonator 34 of a ring or annular shape to a support base 35 having the same coefficient of linear expansion as said resonator at a central portion in a shielded cavity 33.

The shielded cavity 33 is constituted by baking a silver electrode on the outer surface of a rectangular box-like casing of a ceramic material having the same coefficient of linear expansion as said dielectric resonator 34 and said support base 35.

A coil, of one turn for example, constituting an inductor L51, and another coil, of one turn for example, constituting an inductor L61 are provided within the shielded cavity 33 of dielectric resonator 21a such that they are inductively coupled with a magnetic field of the $TE_{01\delta}$ mode dielectric resonator 34. One end of said coil constituting said inductor L51 is connected to a central conductor of coaxial cable 31. Its other end is connected to the ground conductor of said coaxial cable 31. Similarly, one end of said coil constituting said inductor L61, is connected to a central conductor of coaxial cable 32. Its other end is connected to the ground conductor of said coaxial cable 32. Likewise, coils respectively constituting inductors L52 and L62 are similarly provided within said shielded cavity 33 of said resonator 22a, and coils constituting inductors L53 and L63 are similarly disposed in the shielded cavity 33 of the resonator 23a.

Within each of the $TE_{01\delta}$ mode dielectric resonators 34, a small columnar dielectric member 36 is disposed for frequency tuning. The tuning action is effected by moving said dielectric member 36 in a gradient of electric field so that the resonance frequencies of the respective dielectric resonators 34 can be varied.

The columnar dielectric members 36 for tuning the respective resonators 34 are mounted on one shaft 37 so that by displacing said shaft 37 in the directions indicated by the arrow A1, the resonance frequencies for the three $TE_{01\delta}$ mode dielectric resonators 34 may be adjusted simultaneously.

In the equivalent circuit of the parallel connection multi-stage band-pass filter 30a as shown in FIG. 4(a), the respective dielectric resonators 34 are constituted by a parallel resonance circuit in which two inductors L11 and L21, a variable capacitor VC1, and a loss resistor R1 are connected in parallel to each other; a parallel resonance circuit in which two inductors L12 and L22, a variable capacitor VC2, and a loss resistor R2 are connected in parallel to each other; and a parallel resonance circuit in which two inductors L12 and L23, a variable capacitor VC3, and a loss resistor R3 are connected in parallel to each other.

In the band-pass filter 30a of the channel filter 2 having the construction as described above, an input signal having a power spectrum, for example, characterized by a bandwidth of 300 KHz, is generally uniformly distributed according to the respective resonance frequencies of resonators 21a, 22a, and 23a from the input terminal T1, through the input coaxial cable 31, into said resonators. The input signal thus distributed is composed at the respective connecting points through the output coaxial cable 32, and is thereafter output from the output T2.

Figure 5:
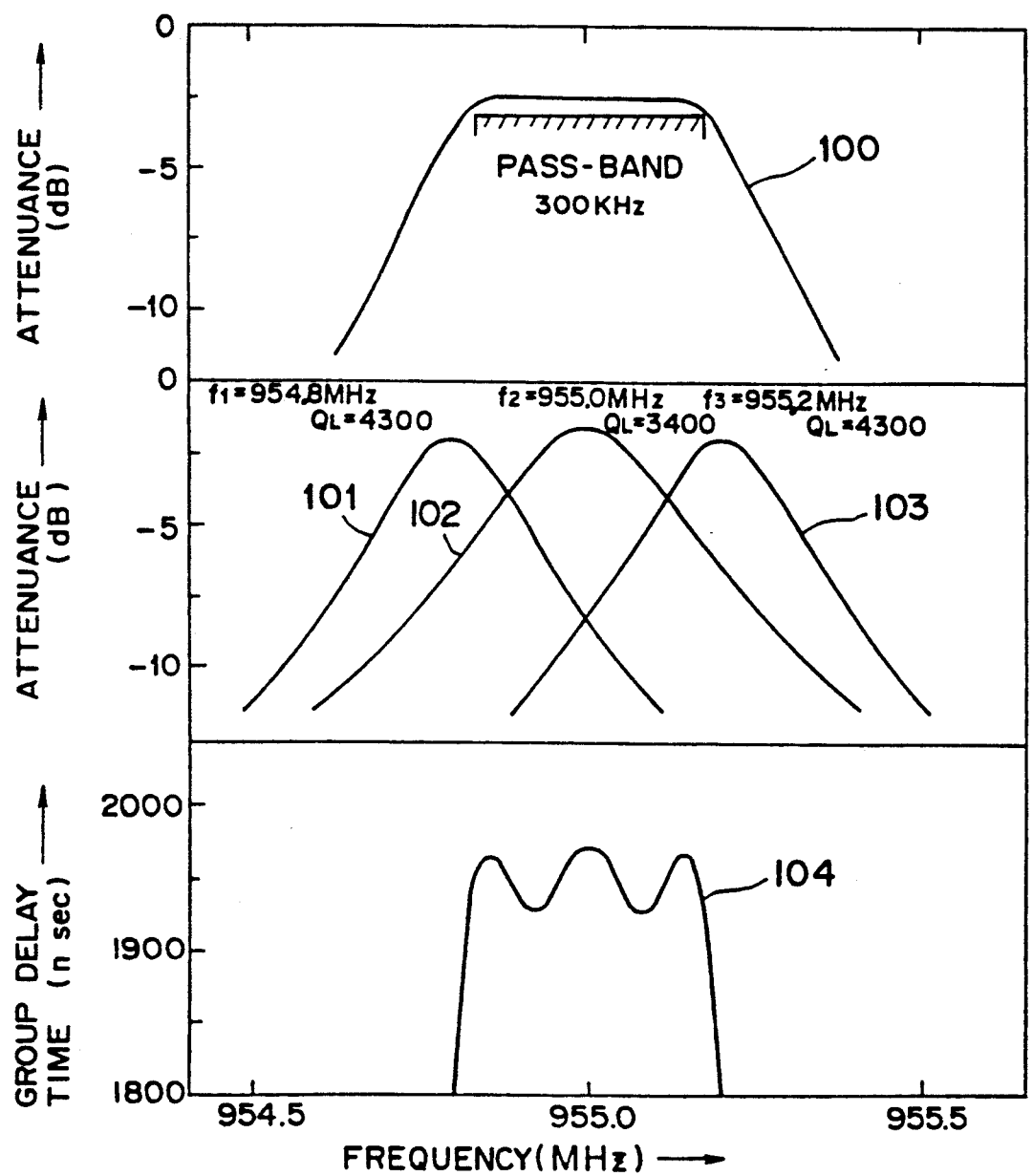
FIG. 5 is a graphic diagram showing the frequency characteristics of attenuation and group delay time of the band-pass filter of FIG. 3(a) for one channel of a mobile communication system.

FIG. 5 shows the frequency characteristic curve 100 of the positive direction transfer function of the band-pass filter 30a shown in FIG. 3(a). It also shows the frequency characteristic curves 101, 102 and 103 of the positive direction transfer functions of the respective resonators 34, and the frequency characteristic curve 104 of the group delay time of said band-pass filter 30a.

The above band-pass filter 30a has a pass-band width of 300 KHz and a center frequency at 955.0 MHz. The respective resonance frequencies f1, f2 and f3, loaded Q values (QL), and non-loaded Q values (Qo) of the three resonators 34 constituting said parallel connection multi-stage band-pass filter 30a are as follows:

(a) The dielectric resonator 34 constituting the first resonator 21a:

Resonance frequency f1=954.8 MHz QL=4300, Qo=22000

(b) The dielectric resonator 34 constituting the second resonator 22a:

Resonance frequency f2=955.0 MHz QL=3400, Qo=22000

(c) The dielectric resonator 34 constituting the third resonator 23a:

Resonance frequency f3=955.2 MHz QL=4300, Qo=22000

From FIG. 5, it is seen that, in the above band-pass filter 30a, the amount of variation for the frequency characteristic 104 of the group delay time in the pass-band region thereof is approximately 60 nsec, ranging from 1920 nsec to 1980 nsec.

Figure 6:
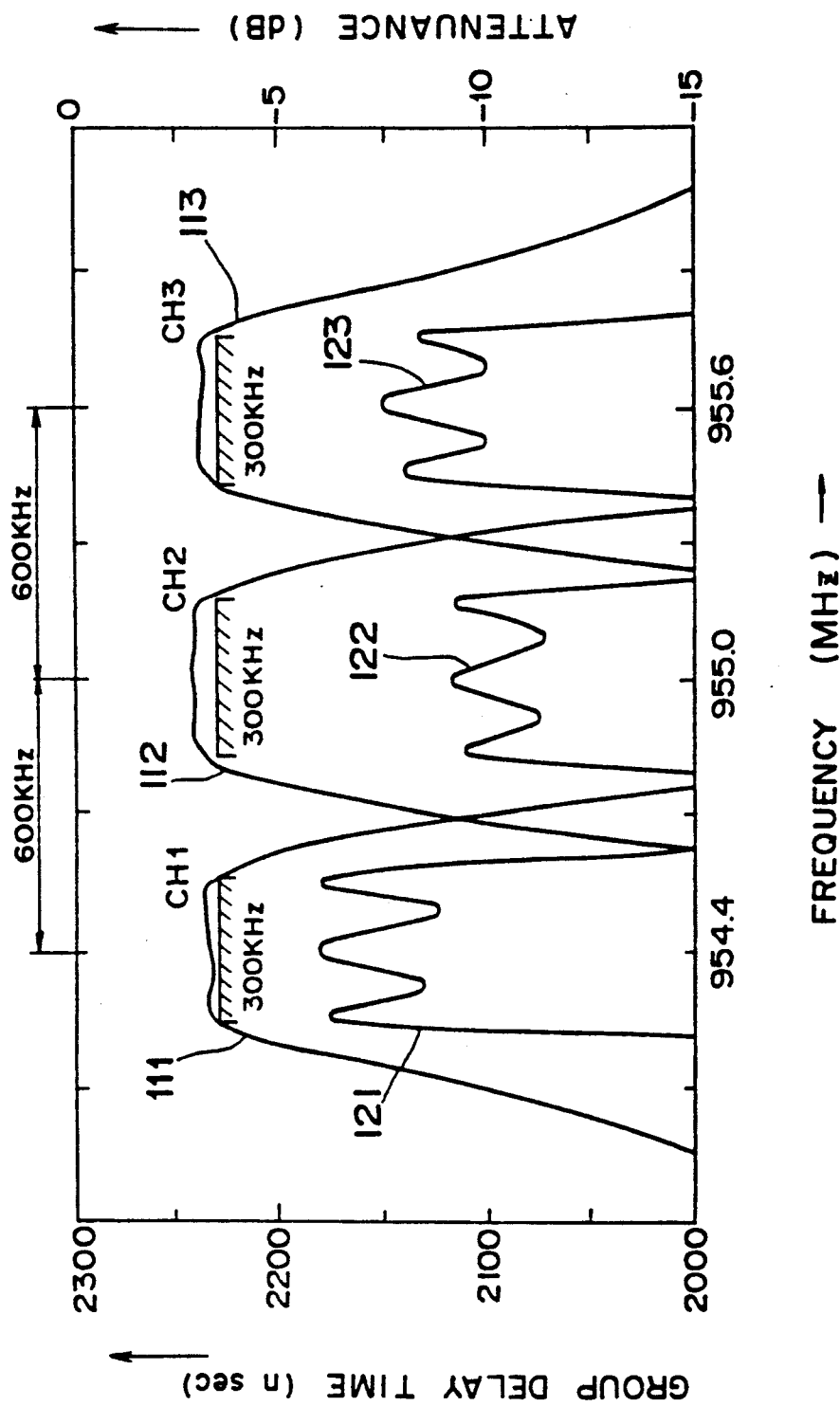
FIG. 6 is also a graphic diagram showing the frequency characteristics of attenuation and group delay time of the three band-pass filters for the respective channels in a case where a band-pass filter of FIG. 3(a) is employed in each of three channels of a mobile communication system.

FIG. 6 shows the frequency characteristics 111, 112 and 113 for the positive direction transfer functions for the respective channels, and the frequency characteristics 121, 122 and 123 for the group delay times, for a radio frequency signal combining/sorting device of three channels, constituted by the band-pass filter 30a as described so far.

In the three-channel filter of FIG. 6, the center frequency for the channel 1 is 954.4 MHz, that for the channel 2 is 9.55.0 MHz, and that for the channel 3 is 955.6 MHz.

The loaded Q values (QL) of the respective resonators are arranged so that the loaded Q values (QL) of the resonators having the highest and lowest resonance frequencies f1 and f3 are set the same, and the loaded Q value (QL) of the resonator having an intermediate resonance frequency f2 is set such that it is slightly smaller than the loaded Q values (QL) of the resonators having the highest and lowest resonance frequencies f1 and f3. The reason for the above setting is that the characteristic curve of the positive direction transfer function of the intermediate resonance frequency f2 is modified by a skirt portion of the frequency characteristic curve of the positive direction transfer function of each resonator. Thus, in order to flatten the frequency characteristic of said band-pass filter, said frequency characteristic constituted by the superposition of the frequency characteristics of the positive direction transfer functions of each of the respective resonators, the loaded Q values (QL) of the respective resonators are set as described above.

Although the relation between the setting of the loaded Q values (QL) of the respective resonators and the frequency characteristics of said resonators depends on the setting of the resonance frequencies, etc., of the resonators, the generally preferred construction is such that the resonators respectively having the highest and lowest resonance frequencies have approximately the same, i.e. equal, loaded Q (referred to as a first loaded Q), and the other resonator having an intermediate resonance frequency has a loaded Q approximately the same as (i.e., equal to or smaller than) said first loaded Q, so that a flatter frequency characteristic of the positive direction transfer function and a still flatter group delay time can be achieved.

Hereinbelow, the setting of said loaded Q for the respective resonators will be described in detail.

For a parallel connection multi-stage band-pass filter constituting three stages, wherein it is assumed that the respective resonators have resonance frequencies f1, f2 and f3 as shown in FIG. 5 and that they have the same non-loaded Q(Qo)=22000, the loaded Q values (QL) for the respective resonators are set as follows (wherein, the loaded Q of the resonator with resonance frequency f1 is represented by QL1, that of the resonator with resonance frequency f2 by QL2, and that of the resonator with resonance frequency f3 by QL3):

(a) Setting example 1:
QL1=4300, QL2=3400 to 4300, more preferably 3500, QL3=4300.
(b) Setting example 2:
QL1=4300, QL2=3350 to 3450, more preferably 3400, QL3=4300.
(c) Setting example 3:
QL1=4300, QL2=2400 and thereunder, QL3=4300.
(d) Setting example 4:
QL1=3000, QL2=2350 to 2450, more preferably 2400, QL=3000.

The above setting example 1 corresponds to the case of appended claim 21, where the loaded Q values (QL) of the respective resonators are set such that the variation amount of the positive direction transfer function within the predetermined pass-band region of said band-pass filter becomes small when the non-loaded Q of each resonator is finite so that a frequency characteristic of extremely flat positive direction transfer function can be obtained.

The setting example 2 corresponds to the case of appended claim 22, where the loaded Q values (QL) of the respective resonators are set such that the respective variation amounts at a plurality of variation points, which are produced in the frequency characteristic of group delay time within the predetermined pass-band region of said band-pass filter, become approximately the same or equal to each other, so that a favorable and still flatter frequency characteristic of group delay time can be achieved.

The setting example 3 shows the setting of the loaded Q values (QL) of the respective resonators for obtaining a characteristic similar to that of the group delay time of the conventional Chebyshev type band-pass filter.

The setting example 4 corresponds to the case of appended claim 23, where the loads Q of the respective resonators are set so that the respective variation amounts at a plurality of variation points, which are produced in the frequency characteristic of group delay time within the predetermined pass-band region of said band-pass filter, become approximately zero whereby a favorable and extremely flat frequency characteristic of group delay time can be achieved.

It is to be noted here that, in the case of a parallel connection multi-stage band-pass filter constituting four stages, the loaded Q values (QL) of the resonators having the two intermediate resonance frequencies (in the intermediate portion of the pass-band among the four resonance frequencies) should be different from each other and should preferably be set to be approximately the same as or smaller than the loaded Q values (QL) of the resonators with the lowest and highest resonance frequencies.

Moreover, in the case of a parallel connection multi-stage band-pass filter constituting five stages, the loaded Q(QL) of the resonators comprising the three intermediate resonance frequencies among five resonance frequencies should be different from each other and should preferably be set to be approximately the same as or smaller than the loaded Q(QL) of the resonators with the lowest and highest resonant frequencies. Furthermore, with respect to the above intermediate three resonance frequencies, the loaded Q value (QL) of the resonator with the resonance frequency at the intermediate portion thereof should preferably be set approximately the same as or smaller than the loaded Q values (QL) of the other resonators, due to the skirt portion of the frequency characteristic curves discussed above.

With respect to parallel connection multi-stage band-pass filters constituting more than six stages, the loaded Q value (QL) of each resonator should be set in a similar manner.

Figure 17:
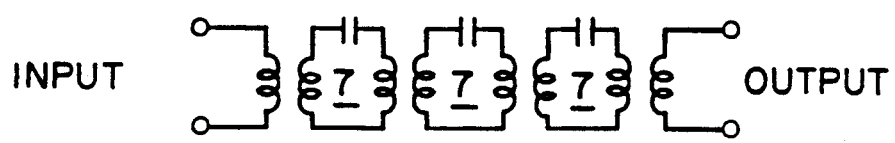
FIG. 17 is a circuit diagram of a conventional band-pass filter (BPF) obtained by subjecting a low-pass filter (LPF) designed according to generally known design theory, to circuit conversion by an inverting formula called an inverter.
Figure 20:
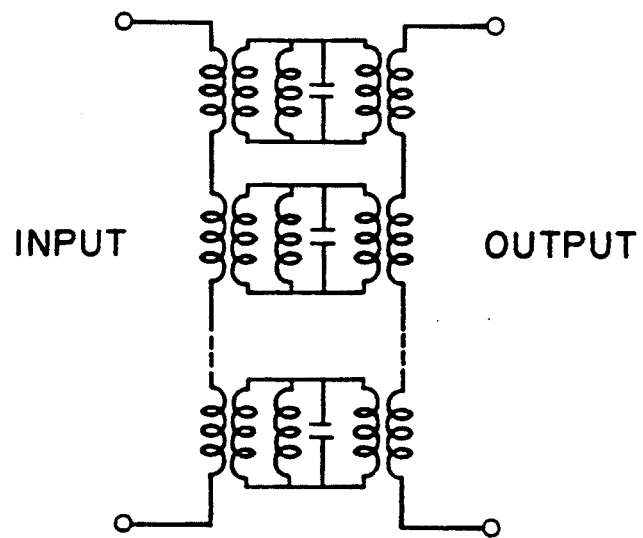
FIG. 20 is a circuit diagram of a simulation model for a parallel coupled circuit version of the conventional series connection multi-stage band-pass filter.
Figure 18:
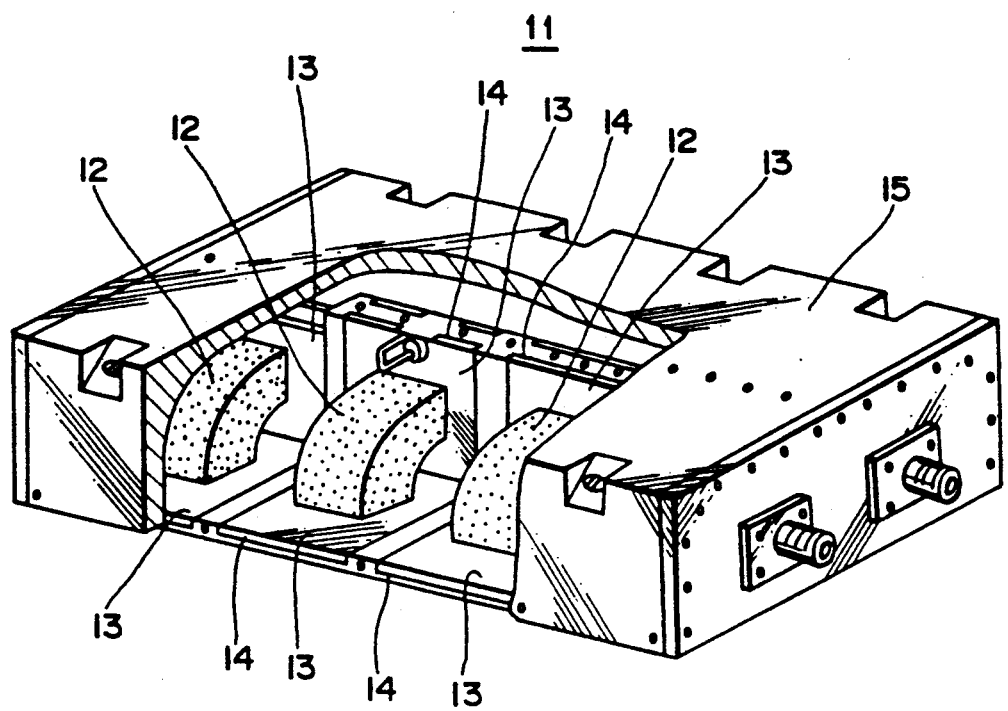
FIG. 18 is a perspective view, partly broken away, of a conventional series connection multi-stage band-pass filter.
Figure 19:
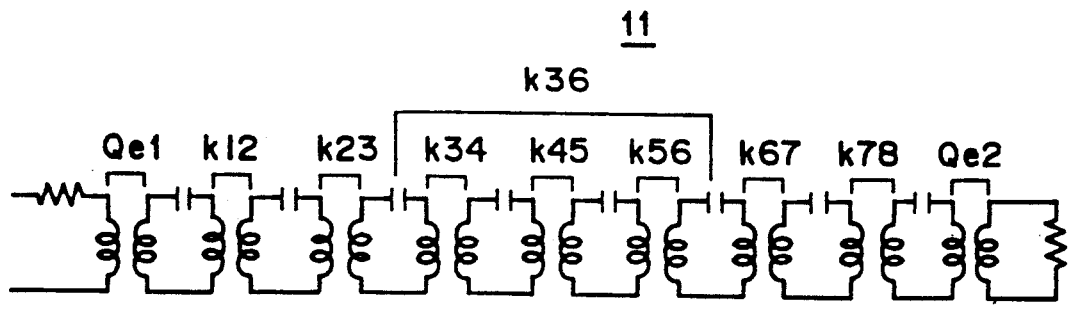
FIG. 19 is a circuit diagram showing an equivalent circuit of the series connection multi-stage band-pass filter of FIG. 18.

The parallel connection multi-stage band-pass filter 30a as described so far will now be compared with the conventional series connection multi-stage band-pass filter 8 shown in FIG. 17. The frequency and group delay time characteristics for the conventional filter corresponding to those in FIGS. 5 and 6 are shown in FIGS. 7 and 8.

Figure 7:
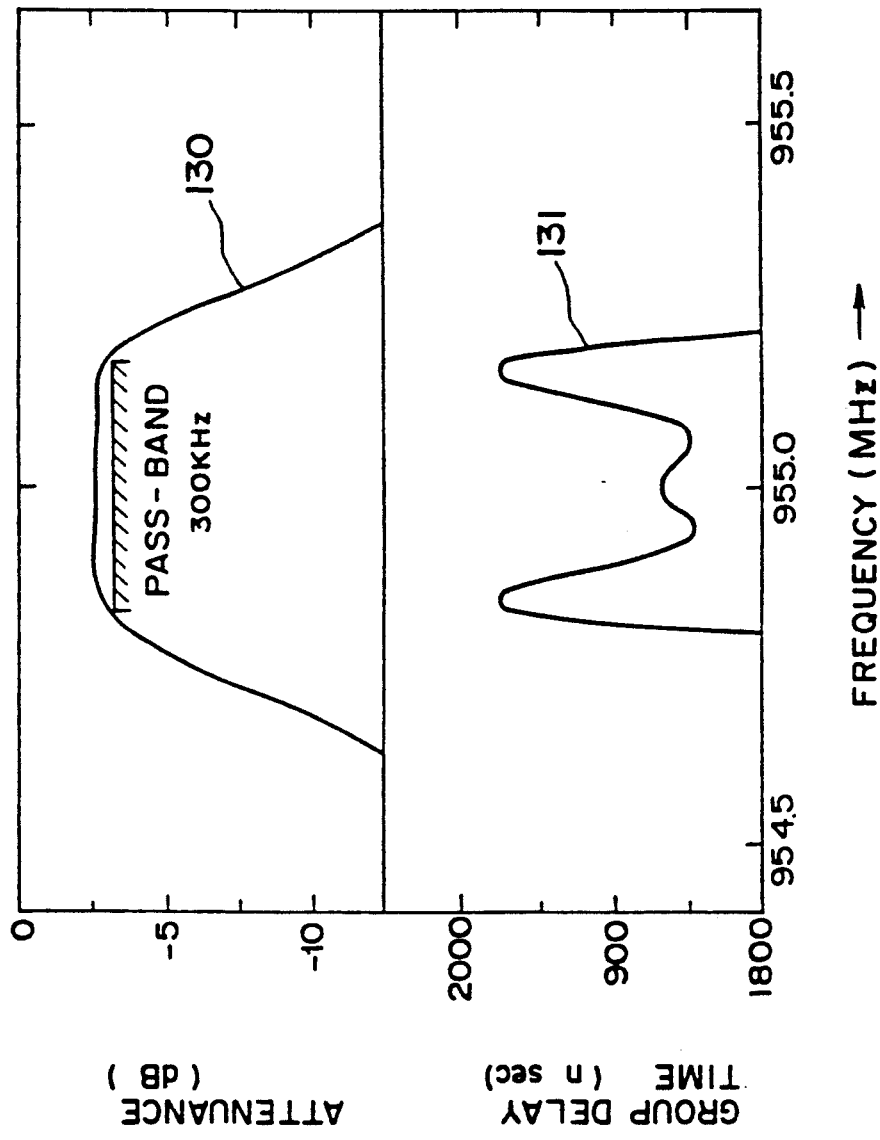
FIG. 7 is a graphic diagram showing the frequency characteristics of attenuation and group delay time of a conventional series connection multi-stage band-pass filter.

It is to be noted here that in FIG. 7, curve 130 represents the frequency characteristic of the positive direction transfer function of said band-pass filter 8, and another curve 131 denotes the frequency characteristic of the group delay time thereof. Similarly, in FIG. 8, which corresponds to the conventional series connection three-stage band-pass filter, curves 141, 142 and 143 show frequency characteristics of the positive direction transfer functions in each of the respective channels, and curves 151, 152 and 153 respectively represent the frequency characteristics of the group delay times in the respective channels.

Figure 8:
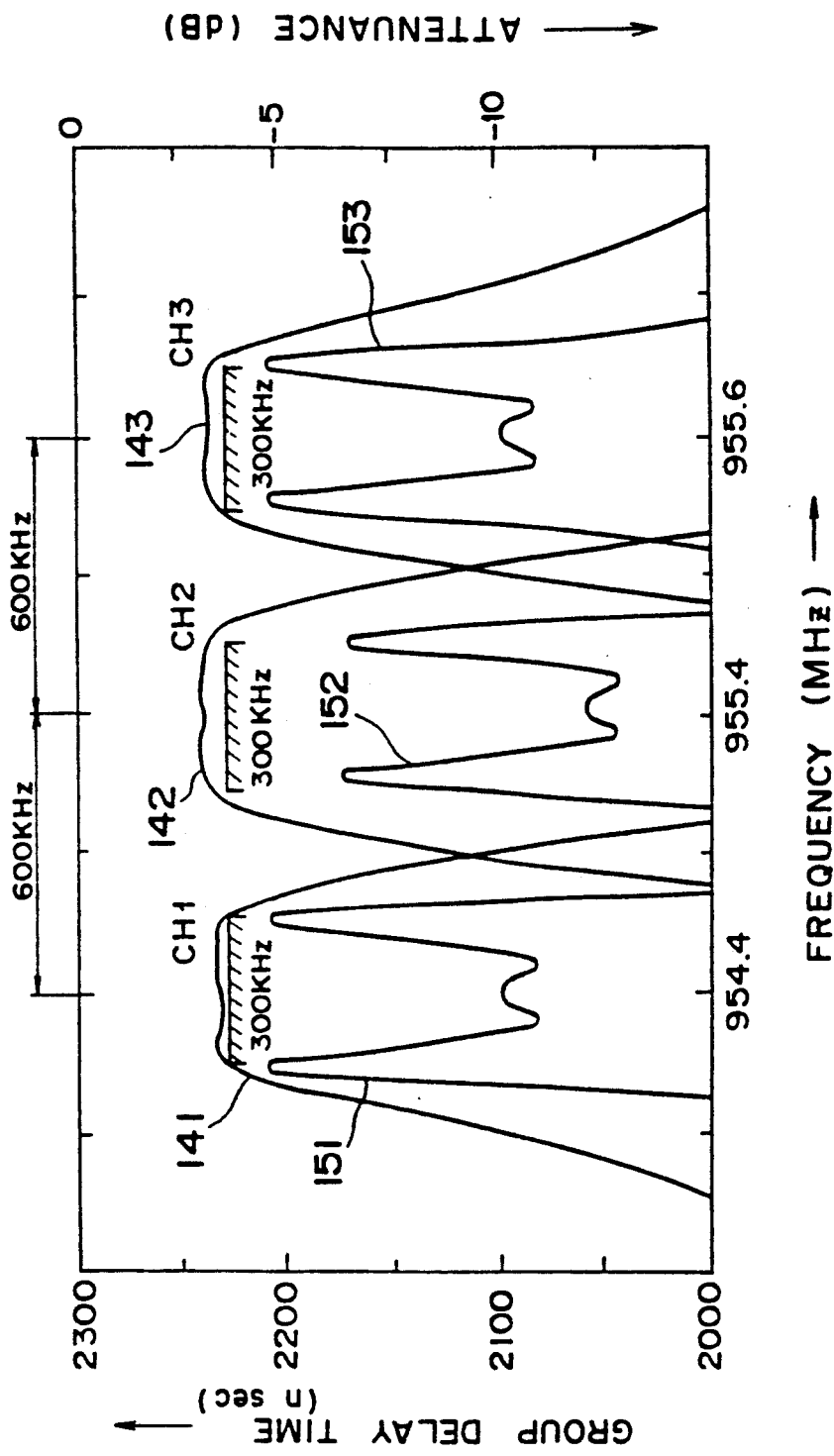
FIG. 8 is a graphic diagram showing the frequency characteristics of attenuation and group delay time of the three band-pass filters for the respective channels in a case where a conventional multi-stage filter is employed in each of three channels of a mobile communication system.

From FIGS. 7 and 8, it is seen that, in the known series connection multi-stage filter 8, the group delay time has a variation amount on the order of 130 nsec or more within the pass-band region. It is also seen that, in the band-pass filter 30a of the present embodiment in FIG. 3(a), the group delay time has been remarkably improved as compared with the conventional filter 8 for a still flatter frequency characteristic.

Figure 3B:
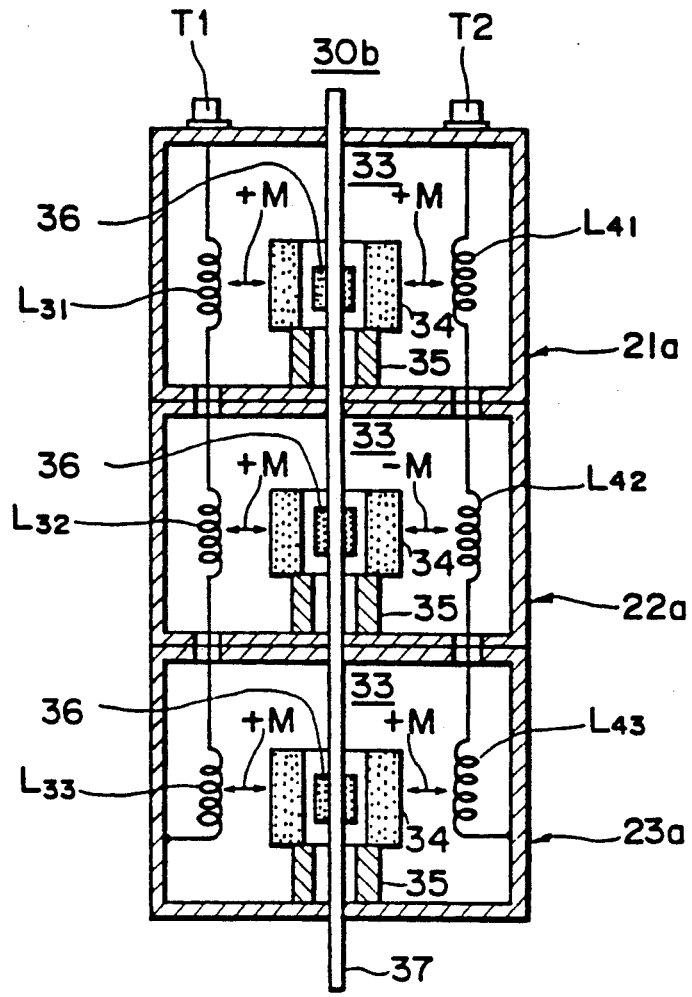
Figure 4B:
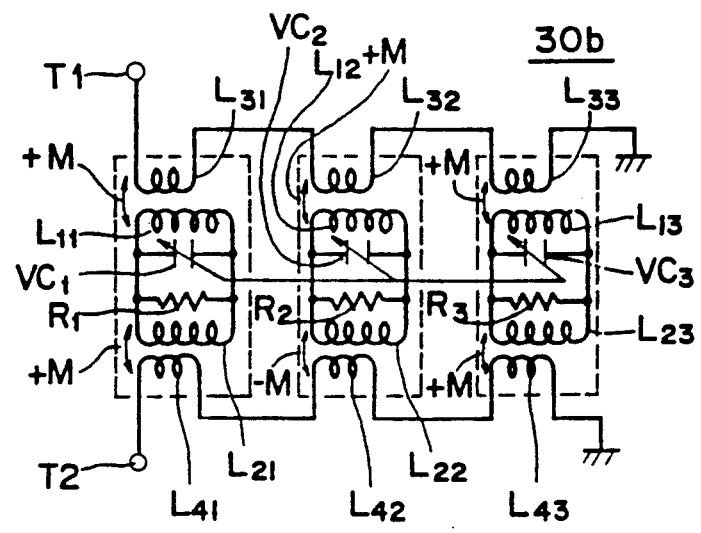

FIG. 3(b) shows a modification 30b of the parallel connection band-pass filter 30a in FIG. 3(a). The equivalent circuit thereof is given in FIG. 4(b). In FIGS. 3(b) and 4(b), like parts in FIGS. 3(a) and 4(a) are designated by like reference numerals.

In the parallel connection multi-stage band-pass filter 30b as shown in FIG. 3(b), as in the fundamental circuit in FIG. 1, inductors L31, L32, and L33 are inductively coupled with the input side of their respective resonators 34 and are connected in series between input T1 and ground, while inductors L41, L42 and L43 are inductively coupled with the output side of their respective resonators 34 and are connected in series between output T2 and ground. Since other aspects of FIG. 3(b) are generally similar to those show in FIG. 3(a), its detailed description has been abbreviated.

Figure 2B:
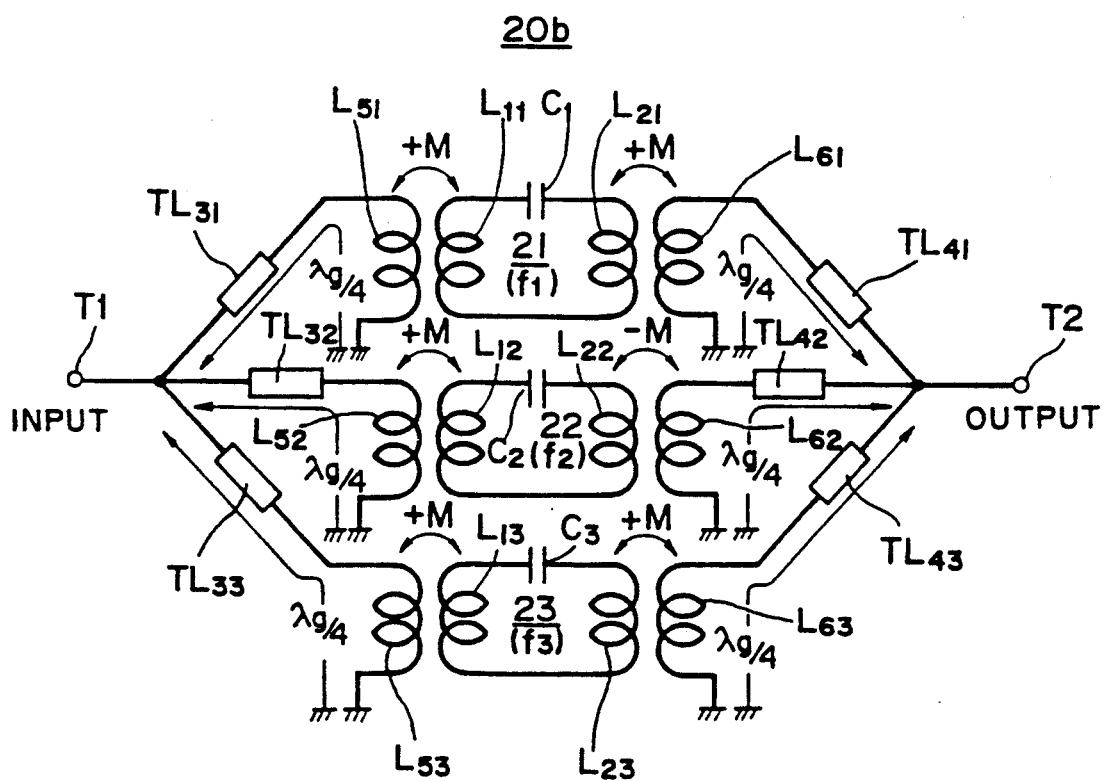

FIG. 2(b) shows a modification 20b of the parallel connection multi-stage band-pass filter 20a in FIG. 2(a), with like parts in FIG. 2(a) being designated by like reference numerals.

In the modified filter 20b in FIG. 2(b), the input T1 is connected to ground through a transmission line TL31 in series with an inductor L51, and also to ground via a transmission line TL32 in series with an inductor L52. Input T1 is also connected to ground through a transmission line TL33 in series with an inductor L53.

In the above arrangement, the electrical length from the input T1 side of the transmission line TL31 to the ground shortcircuiting point through inductor L51 is set at $\lambda g/4$, the electrical length from the input T1 side of the transmission line TL32 to the ground shortcircuiting point through inductor L52 is set at $\lambda g/4$, and the electrical length from the input T1 side of the transmission line TL33 to the ground shortcircuiting point through inductor L53 is set at $\lambda g/4$.

The output T2 is connected to ground through a transmission line TL41 and an inductor L61, through a transmission line TL42 and an inductor L62, and through a transmission line TL43 and an inductor L63.

In the above arrangement, the electrical length from the output T2 side of the transmission line TL41 to the ground shortcircuiting point through inductor L61 is set at $\lambda g/4$, the electrical length from the output T2 side of the transmission line TL42 to the ground shortcircuiting point through inductor L62 is set at $\lambda g/4$, and the electrical length from the output T2 side of the transmission line TL43 to the ground shortcircuiting point through inductor L63 is set at $\lambda g/4$.

The resonance circuits 21, 22, and 23 shown in FIG. 2(b) are constructed in a similar manner to those in FIG. 2(a), and the coupling between the respective inductors is similarly effected by inductive coupling for electrical connection.

In the parallel connection multi-stage band-pass filter 20b having the construction as described so far, at the input T1 side thereof, the respective impedances of the ground shortcircuiting points as viewed from connection points at the input T1 side of transmission line TL31 through inductor L51, at the input T1 side of transmission line TL32 through inductor L52, and at the input T1 side of transmission line TL33 through inductor L53, are respectively set to become infinite, while inductors L51, L52 and L53 which function as impedance matching means are connected in parallel to the input T1 through transmission lines TL31, TL32, and TL33.

Meanwhile, at the output T2, the respective impedances of the ground shortcircuiting points as viewed from connecting points at the output T2 side of transmission line TL41 through inductor L61, at the output T2 side transmission line TL42 through inductor L62, and at the output T2 side of transmission line TL43 through inductor L632, are respectively set to become infinite, while inductors L61, L62 and L63 which function as impedance matching means are connected in parallel with the output T2 through transmission lines TL41, TL42 and TL43.

Accordingly, the series connection resonance circuits 21, 22 and 23 are respectively connected in parallel between the signal input and output ends T1 and T2 through the impedance matching means referred to above.

Thus, the parallel connection multi-stage band-pass filter 20B having the construction as described above has a function and effect similar to that of the band-pass filter 20a shown in FIG. 2(a).

In the channel filter 30a explained with reference to FIG. 3(a), it is so arranged that the respective columnar dielectric members 36 of the three $TE_{01\delta}$ mode dielectric resonators are fixed on one shaft 37 so as to simultaneously adjust the resonance frequencies of the three resonators 21a, 22a and 23a by moving said shaft. However, that arrangement may be so modified for example, as shown in FIGS. 10(a), 10(b) and 10(c), such that three shafts 41, 42, and 43 are respectively provided for each of the three $TE_{01\delta}$ mode dielectric resonators 21a, 22a, and 23a, thereby facilitating independent adjustment of the resonance frequencies of said resonators by moving said shafts 41, 42, and 43 in the directions indicated by the arrows A2.

Figure 10A:
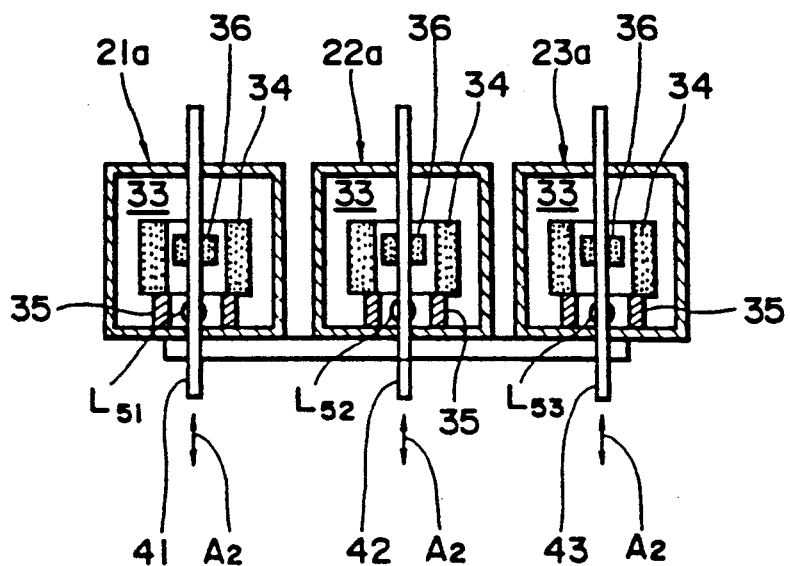
FIGS. 10(a), 10(b) and 10(c) are respectively a front sectional view, a top plan view and a side sectional view showing a modification of the band-pass filter of FIG. 3(a)
Figure 10B:
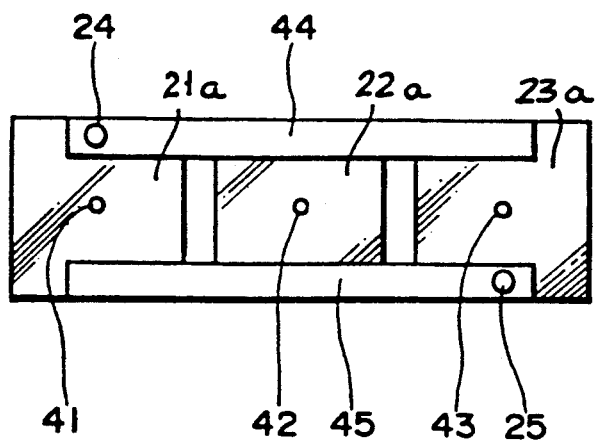

As is most clearly seen from FIG. 10(b), the channel filter 30a referred to above includes an input coaxial cable 44 and an output coaxial cable 45 disposed in parallel to each other, and said $TE_{01\delta}$ mode dielectric resonators 21, 22a and 23a which were described in reference to FIG. 3(a), are disposed on said input and output coaxial cables 44 and 45.

Figure 10C:
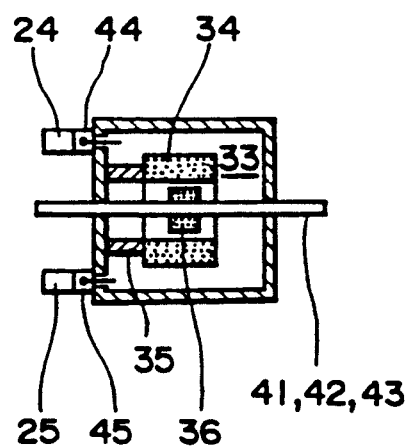

In the arrangement of FIGS. 10(a), 10(b) and 10(c), by moving the respective shafts 41, 42 and 43 of said resonators 21a, 22a, and 23a, it is possible to independently alter the resonance frequencies of the TE$_{01\delta}$ mode dielectric resonators 21a, 22a, and 23a.

2nd embodiment

Figure 11:
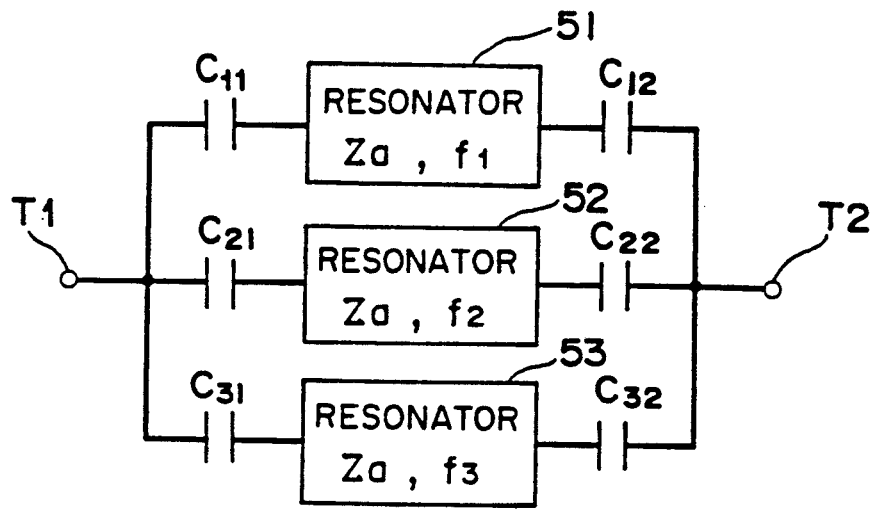
FIG. 11 is a block diagram showing a circuit of a capacitance coupled type parallel connection multi-stage band-pass filter according to a second embodiment of the present invention.

FIG. 11 shows a fundamental circuit of a capacitively coupled parallel connection multi-stage band-pass filter according to a second embodiment of the present invention.

In the filter of FIG. 11, the signal input T1 is connected to the output T2 through a parallel connection of resonators 51, 52, and 53, said resonators having respective input and output coupling capacitors C11 and C12, C21 and C22, and C31 and C32 connected between said resonators and said signal input and output T1 and T2. Said resonators have a characteristic impedance Za and a resonant frequencies f1, f2, and f3 corresponding to resonators 51, 52, and 53 respectively.

In the above arrangement, the resonance frequencies f1, f2, and f3 of the respective resonators 51, 52 and 53 are set to be different from, but close to each other as in the first embodiment so as to function as a band-pass filter with the above resonance frequencies forming the center frequency for the band-pass.

Accordingly, the parallel connection multi-stage band-pass filter as shown in FIG. 11 has a pass-band region in which the pass-bands of the respective resonators 51, 52 and 53 are superimposed one upon another.

Figure 12A:
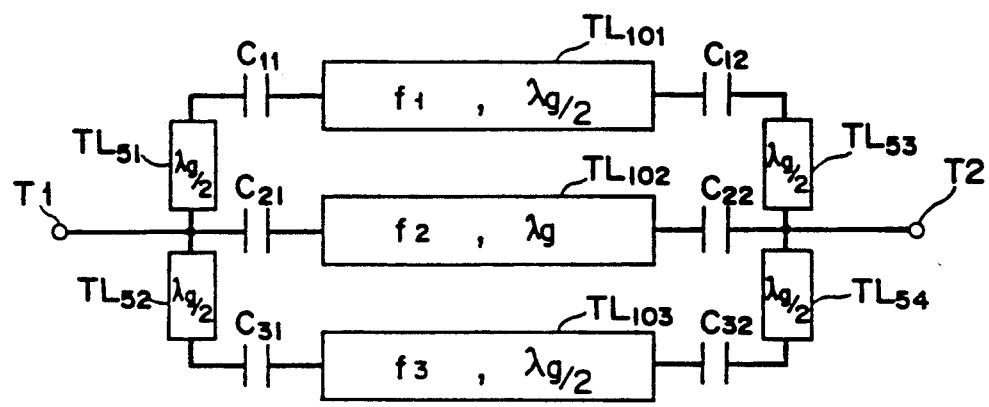
FIGS. 12(a) and 12(b) are circuit diagrams showing examples of band-pass filters in which the fundamental circuit of FIG. 11 is realized in a microwave band region.

FIG. 12(a) shows a capacitively coupled parallel connection multi-stage band-pass filter which employs transmission lines as resonators.

In FIG. 12(a), a transmission line TL101 having an electrical length of λg/2 is used as resonator 51, a transmission line TL102 having an electrical length of λg is used as resonator 52, and a transmission line TL103 having an electrical length of λg/2 is used as resonator 53. In the above arrangement, only transmission lines TL101 and TL103 have an electrical length of λg/2.

As compared with the fundamental circuit of FIG. 11, in the band-pass filter of FIG. 12(a), at input T1, a transmission line TL51 having an electrical length of λg/2 is inserted between input T1 and capacitor C11 for impedance matching, and another transmission line TL52 having an electrical length of λg/2 is inserted between input T1 and capacitor C31. Similarly, at output T2, a transmission line TL 53 having an electrical length of λg/2 is inserted between output T2 and capacitor C12 for impedance matching, and another transmission line TL54 having an electrical length of λg/2 is inserted between output T2 and capacitor C32.

It is to be noted here that the reason for setting the electrical length of the transmission line TL102 having an intermediate resonance frequency f2 to λg, and the electrical length of the transmission lines TL101 and TL103 having respective resonance frequencies f1 and f3 to λg/2, is to invert the phase of the signal passing through the transmission line TL102 as compared with the phase of the signals passing through transmission lines TL101 and TL103 in an analogous manner as in the first embodiment.

In the band-pass filter having the construction as described above, the transmission lines TL101, TL102 and TL103 which function as resonators are connected between the signal input and output T1 and T2 in a parallel relation through coupling capacitors C11 and C12, C21 and C22, and C31 and C32, and transmission lines TL51, TL52, TL53 and TL54 for impedance matching.

When a microwave signal is applied to the input T1 of the band-pass filter of FIG. 12(a), said microwave signal is distributed to pass through the transmission lines TL101, TL102, and TL103 and thereafter, composed to be output from output T2.

The above band-pass filter has a the function and effect similar to that of the band-pass filter described in reference to FIGS. 2(a) and 2(b).

Figure 15:
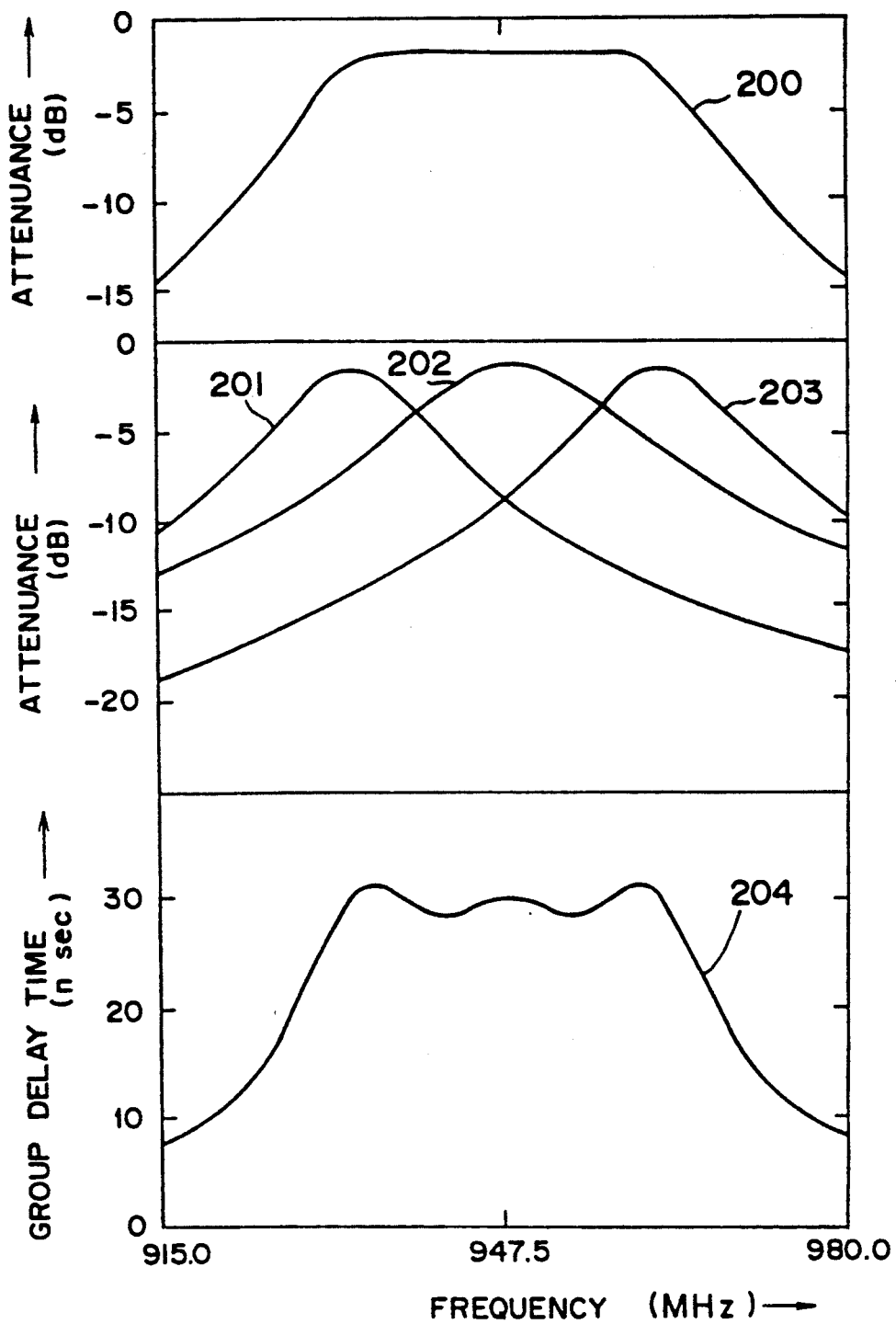
FIG. 15 is a graphic diagram showing the frequency characteristics of attenuation and group delay time for the band-pass filter of FIG. 12(a)

FIG. 15 shows a characteristic curve 200 of the positive direction transfer function of the band-pass filter shown in FIG. 12(a), the frequency characteristic curves 201, 202 and 203 of the positive direction transfer functions of the respective transmission lines TL101, TL102, and TL103 when they function as resonators, and the frequency characteristic curve 204 of the group delay time of said band-pass filter.

To use the above band-pass filter as a receiving filter in a moving unit in a mobile communication system, a pass-band width of 25 MHz and a center frequency thereof of 947.5 are desirable. Additionally, the respective resonance frequencies f1, f2 and f3, loaded Q values (QL), and non-loaded Q values (Qo) of the three transmission lines TL101, TL102, and TL103 constituting a parallel connection multi-stage band-pass filter are as follows:

(a) Transmission line TL101:
Resonance frequency f1=936.85 MHZ QL=65, Qo=430

(b) Transmission line TL102:
Resonance frequency f2=947.5 MHz QL=25, Qo=430

(c) Transmission line TL103:
Resonance frequency f3=958.15 MHz QL=65, Qo=430

From FIG. 15, it is seen that in the above band-pass filter of FIG. 12(a), the frequency characteristics as represented by the curves 200 and 203 of the positive direction transfer function are generally flat within the predetermined pass-band width of 25 MHz, with the variational amount of the frequency characteristic of the group delay time, as represented by curve 204, being about 2 nsec.

Figure 13A:
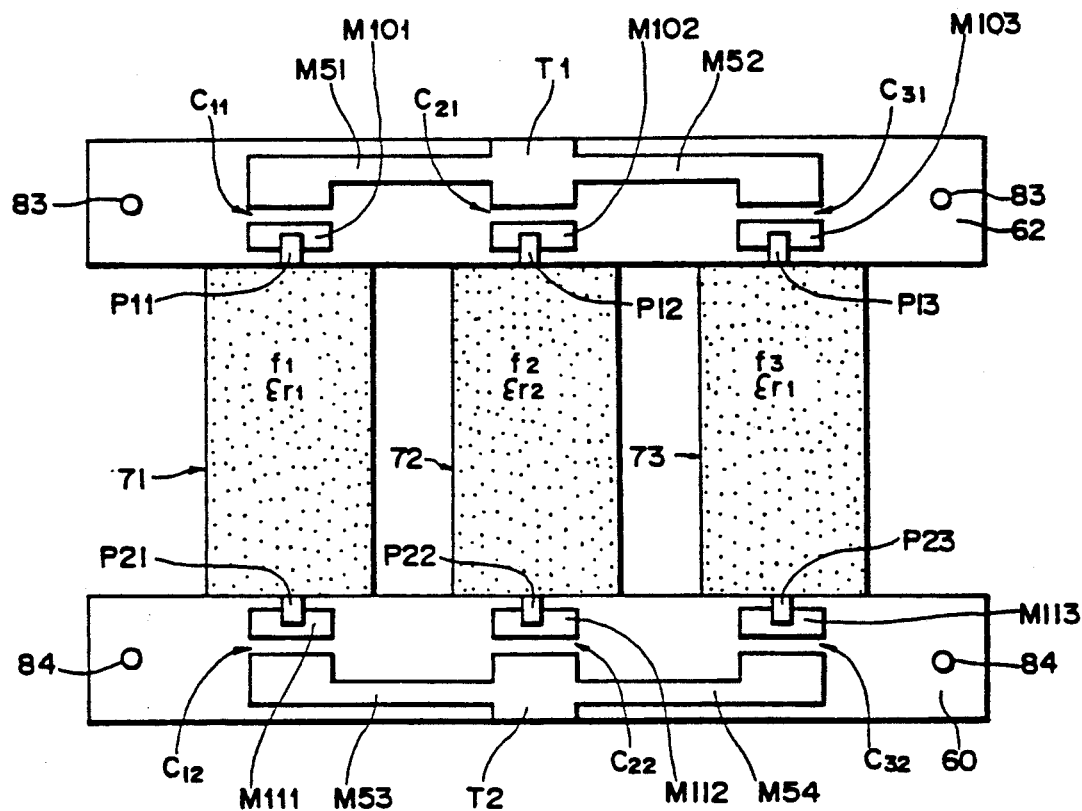
FIG. 13(a) is a schematic top plan view showing a parallel connection multi-stage band-pass filter in which the resonators in FIGS. 12 are comprised of dielectric coaxial resonators.
Figure 13B:
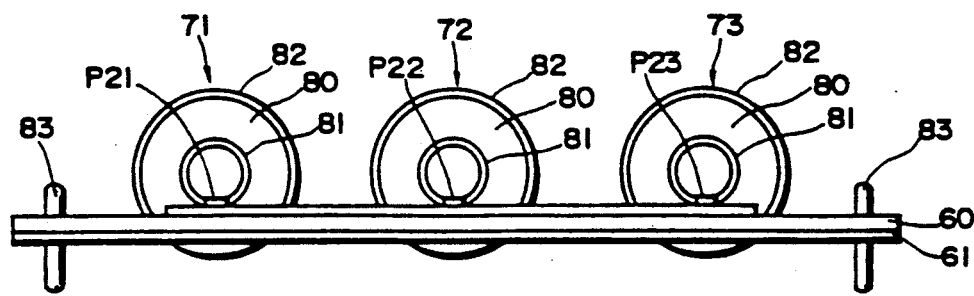
FIG. 13(b) is a side elevational view of the band-pass filter of FIG. 13(a)

FIGS. 13(a) and 13(b) show a parallel connection multi-stage band-pass filter which employs coaxial dielectric resonators 71, 72, and 73 for use as resonators, and micro-strip lines M51, M52, M53 and M54 for use as transmission lines for impedance matching.

In the band-pass filter of FIGS. 13(a) and 13(b), micro-strip line M51 has an electrical length of λg/2 and micro-strip line M52 has an electrical length of λg/2, both being branched from input T1 and formed on a dielectric substrate 62 having a grounding conductor over its entire reverse surface (not shown). Conductors M101 and M103 are formed in positions spaced from the edges of the respective micro-strip lines M51 and M52 by a predetermined interval, and conductor M102 is formed in a position spaced from the conductor of input T1 by a predetermined distance. The respective conductors M101, M102 and M103 are formed so as to be arranged in a straight line with the same interval provided therebetween. Additionally, on the dielectric substrate 62, a capacitor C11 is formed between the corresponding edges of micro-strip line M51 and conductor M101, capacitor C21 is formed between the corresponding edges of the conductor of input T1 and conductor M102, and capacitor C31 is formed between the corresponding edges of micro-strip line M52 and conductor M103. It is to be noted here that the dielectric substrate 62 is supported by a plurality of support rods 83.

Similarly, micro-strip line M53 has an electrical length of λg/2 and micro-strip line M54 has an electrical length of λg/2, both being branched from output T2 an formed on a dielectric substrate 60 having a grounding conductor 61 over its entire reverse surface (not shown). Conductor M111 and M113 are formed in positions spaced from the edges of respective micro-strip lines M53 and M54 by a predetermined interval, and conductor M112 is formed in a position spaced from the conductor of output T2 by a predetermined distance. The respective conductors M111, M112 and M113 are formed so as to be arranged in a straight line with the same interval provided therebetween. Additionally, on the dielectric substrate 60, a capacitor C12 is formed between corresponding edges of micro-strip line M53 and conductor M111, a capacitor C22 is formed between the corresponding edges of the conductor of output T2 and conductor M112, and capacitor C32 is formed between the corresponding edges of micro-strip line M54 and conductor M113. It is to be noted here that the dielectric substrate 60 is supported by a plurality of support rods 84.

Coaxial dielectric resonator 71 is constituted by a cylindrical dielectric member 80 having a dielectric constant $\epsilon r1$ and an electrical length of λg/2. An inner peripheral conductor 81 is formed on the inner peripheral surface of dielectric member 80 and on an outer peripheral conductor 82 formed on the outer peripheral surface of said dielectric member 80 and has a resonant frequency f1. Pins P11 and P21 projecting from opposite faces of resonator 71 are connected by soldering to said inner peripheral conductor 81 and are respectively connected to conductors M101 and M111 also by soldering. Coaxial resonator 72 has a construction similar to that of above resonator 71 where pins P12 and P22 are connected to inner peripheral conductor 81 thereof and are respectively connected by soldering to the above conductors M102 and M111 by soldering. Finally, coaxial dielectric resonator 73 is constructed in a similar manner as resonators 71 and 72 where pins P13 and P23 are connected to inner peripheral conductor 81 thereof are respectively connected to conductors M103 and M113 by soldering.

It is to be noted here that, although the respective dielectric resonators 71, 72 and 73 have the same electrical length of λg/2, resonator 72 is provided with a dielectric constant $\epsilon r2$ different from dielectric resonators 71 and 73, so that a signal passing through resonator 72 will be inverted with respect to signals passing through dielectric resonators 71 and 73 in an analogous manner as in the first embodiment.

Figure 14:
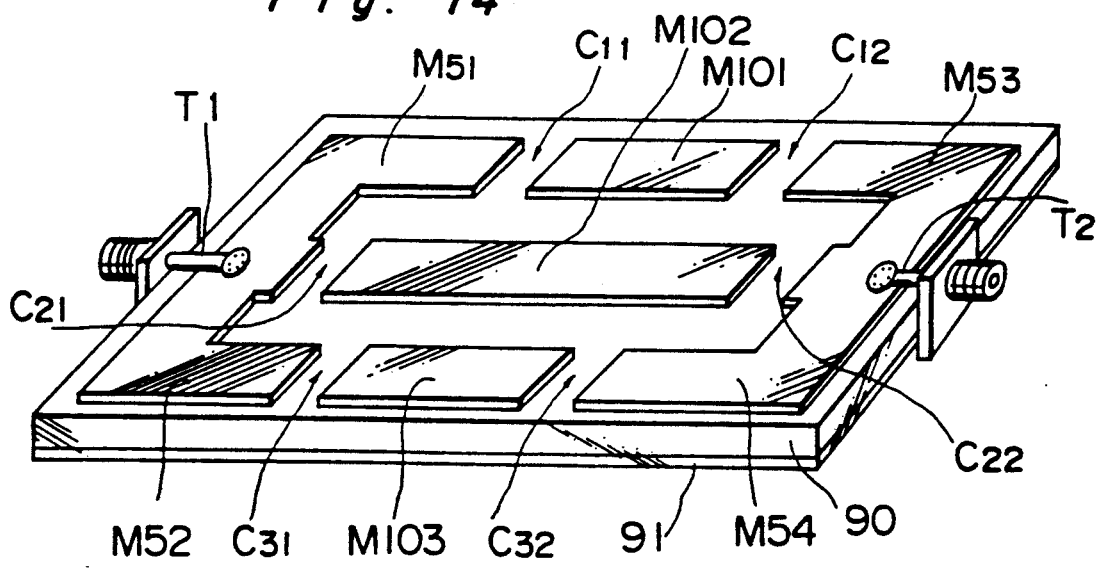
FIG. 14 is a perspective view showing the parallel connection multi-stage band-pass filter in which the resonators in FIG. 12(a) are comprised of micro-strip lines.

FIG. 14 shows a capacitively coupled parallel connection multi-stage band-pass filter in which micro-strip lines M101, M102 and M103 are employed as resonators. In FIG. 14, like parts in FIG. 13(a) are designated by like reference numerals for brevity of explanation.

In the band-pass filter of FIG. 14, on top of a dielectric substrate 90 formed with a grounding electrode 91 over its entire reverse surface, micro-strip lines M51, M52, M53, M54, M101, M102, and M103 are formed. Micro-strip lines M101, M102 and M103 correspond respectively to transmission lines TL101, TL102 and TL103 in FIG. 12(a).

Figure 12B:
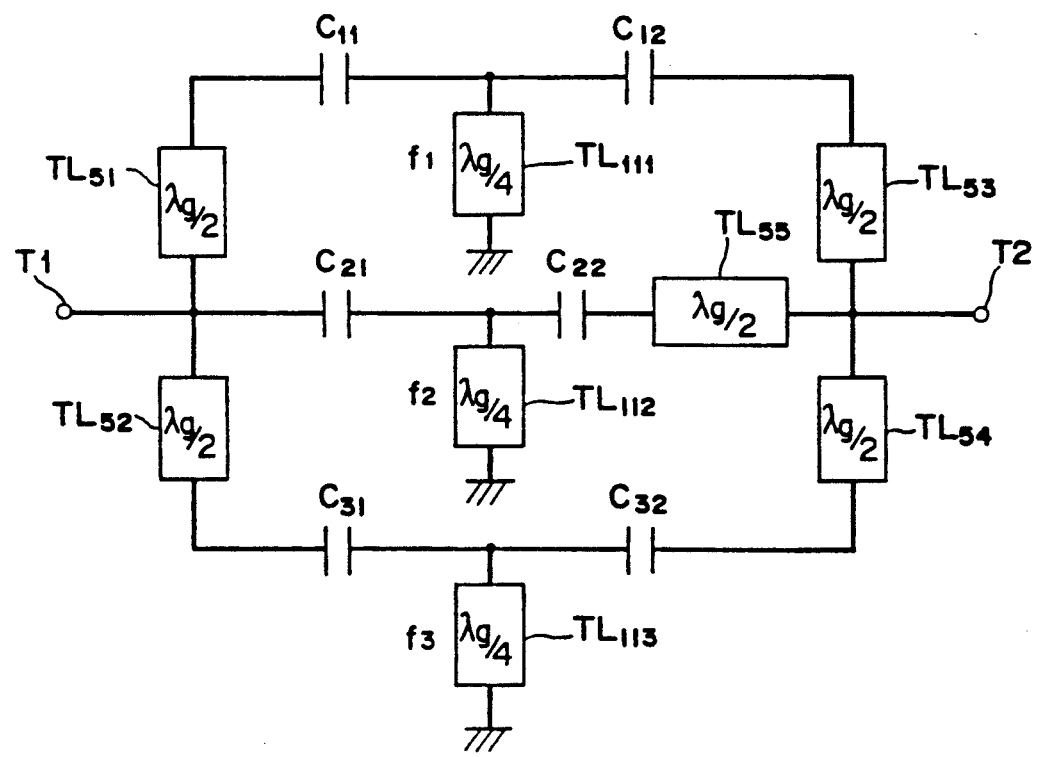

FIG. 12(b) shows a modification of the capacitively coupled parallel connection multi-stage band-pass filter shown in FIG. 12(a).

In the band-pass filter of FIG. 12(b), a transmission line TL111 having an electrical length of λg/4. and being shortcircuited at one end to ground is employed as resonator 51, transmission line TL112 having an electrical length of λg/4 and being shortcircuited at one end to ground is employed as resonator 52, and transmission line TL113 having an electrical length of λg/4 and shortcircuited at one end to ground is utilized as resonator 53. Transmission lines Tl111, TL112 and TL113 respectively constitute resonators with electrical length of λg/4.

More specifically, as compared with the circuit of the band-pass filter shown in FIG. 12(a), coupling capacitors C11 and C12 are directly connected to each other and transmission line TL111 is connected between ground and a junction between said capacitors C11 and C12, coupling capacitors C21 and C22 are directly connected to each other and transmission line TL112 is connected between ground and a junction capacitors C21 and C22, and coupling capacitors C31 and C32 are directly connected to each other and transmission line TL113 is connected between ground and a junction between said capacitors C31 and C32. Additionally, between capacitor C22 and output T2 is disposed a transmission line TL55 having an electrical length of λg/2 inserted for inverting the phase of signals in a similar manner as in the first embodiment.

The band-pass filter of FIG. 12(b) having the construction as described so far has an effect and function similar to the band-pass filter of FIG. 12(a) except for the employment of the transmission lines TL111, TL112 and TL113 as the resonators, all with electrical length λg/4.

Comparison of features between the parallel connection multi-stage band-pass filter and the series connection multi-stage band-pass filter A comparison of features possessed by a parallel connection multi-stage band-pass filter according to the present invention and the features of a conventional series connection multi-stage band-pass filter is shown in FIG. 9 in which the term "degrees of freedom of electrical characteristic" is defined as a sum of the number of resonant frequencies of resonance circuit which can be set independently, plus the number of couplings present between the input and output terminals of said band-pass filter.

As seen from FIG. 9, since in a series connection multi-stage band-pass filter comprising, for example, three stages, the number of resonance frequencies is equal to 3 and the number of couplings is equal to 4, the number of degrees of freedom in electrical characteristic is 7. On the other hand, a parallel three-stage filter has 6 couplings. Accordingly, in the parallel connection multi-stage band-pass filter comprised of three stages, the number of degrees of freedom in electrical characteristic is increased by 2 in comparison with the series connection multi-stage band-pass filter in three stages, due to the ability to adjust the frequency characteristic of said parallel connection band-pass filter including the group delay characteristic, etc. Thus, for example, the frequency characteristic of the group delay characteristic may more easily be improved so as to be still flatter than in conventional arrangements.

It should be noted here that in the simulation model of the parallel-coupled circuit as described earlier with reference to the prior art, the vibration modes are coupled to each other between the respective resonators. In contrast, such vibration modes between the respective resonators are not coupled to each other, but are independent of each other, in the parallel connection multi-stage band-pass filter according to the present invention. Therefore, the frequency characteristic of said band-pass filter is such that the band-pass characteristics of the respective resonators (each functioning as a band-pass filter) constituting said parallel connection multi-stage band-pass filter, are superimposed one upon another.

The above fact is the main point in which the simulation model of the conventional parallel-coupled circuit differs from the parallel connection multi-stage band-pass filter of the present embodiment, whereby the number of degrees of freedom of the electrical characteristic is achieved as previously stated, and the associated frequency characteristics such as the positive direction transfer function and the group delay time, etc. may be more readily flattened within the pass band region as compared with conventional arrangements.

Other modifications

In the foregoing embodiments, although $TE_{018}$ mode dielectric resonators, coaxial dielectric resonators, and resonators constituted by transmission lines, i.e. transmission line type resonators, are employed as resonators, the concept of the present invention is not limited in its application to such embodiments alone, but rather includes dielectric resonators employing other oscillation modes or other kinds of resonators such as cavity resonators, semi-coaxial resonators, LC resonators, helical resonators, etc. when necessary for implementing a alternate embodiments of the present invention.

Similarly, in the foregoing embodiments, the band-pass filter was constituted by connecting three resonators in parallel to each other. Alternatively the arrangement may be modified, for example, so as to constitute a band-pass filter by connecting, in parallel, a plurality comprising two, or more than four, resonators.

It should also be noted here that the parallel connection multi-stage band-pass filter according to the embodiments as is described so far may be applied not only to the channel filter of the radio frequency signal combining/sorting device for a mobile unit communication system, or to a transmission/receiving filter for said moving unit, etc., but also to other band-pass filters designed for generally different end uses.

In particular, the industry requires an improved digital mobile communication system in which audio signals or data signals are subjected to digital modulation for transmission, having a band-pass filter having a wider and flatter pass-band region, and a frequency characteristic for wider and still flatter group delay time. Therefore, the band-pass filter according to the present invention is particularly useful as a band-pass filter constituting part of such digital mobile communication system.

Although examples of the present invention have been fully described with reference to the accompanying drawings, it is to be noted that various changes and modifications will be apparent to those skilled in the art. Therefore, unless such changes and modifications otherwise depart from the scope of the present invention, they should be construed as included therein.

What is claimed is:

1. A parallel connection multi-stage band-pass filter comprising an input terminal and an output terminal for signals, and a plurality of resonators each provided with first and second ports;

said resonators having respective resonant frequencies different from and close to each other;

said first port of each of said resonators being electrically connected to said input terminal through first impedance matching means;

said second port of each of said resonators being electrically connected to said output terminal through second impedance matching means;

wherein said first port of each of said resonators is electrically connected to said input terminal through said first impedance matching means by capacitive coupling;

said second port of each of said resonators being electrically connected to said output terminal through said second impedance matching means by capacitive coupling.

2. A parallel connection multi-stage band-pass filter as claimed in claim 1, wherein the resonators are transmission line type resonators.

3. A parallel connection multi-stage band-pass filter as claimed in claim 2, wherein said transmission lines type resonators are coaxial dielectric resonators or micro-strip lines.

4. A parallel connection multi-stage band-pass filter as claimed in claim 1, wherein those resonators respectively having the maximum and minimum resonant frequencies of said plurality of resonators have approximately the same first loaded Q, and another resonator having an intermediate resonant frequency having a second loaded Q approximately the same as or smaller than said first loaded Q, and still another resonator having an intermediate resonant frequency having a third loaded Q approximately the same as or smaller than said second loaded Q.

5. A parallel connection multi-stage band-pass filter as claimed in claim 4, wherein the loaded Q of each of said resonators is such that an amount of a variation of positive direction transfer function of said band-pass filter within a predetermined pass-band region becomes small when a non-loaded Q of each of said resonators is finite.

6. A parallel connection multi-stage band-pass filter as claimed in claim 4, wherein the loaded Q of each of said resonators is such that respective amounts of variation at a plurality of variation points in the frequency characteristic of group delay time within a predetermined pass-band region of said band-pass filter become approximately equal to each other.

7. A parallel connection multi-stage band-pass filter as claimed in claim 4, wherein the loaded Q of each of said resonators is such that respective amounts of variation at a plurality of variation points in the frequency characteristic of group delay time within a predetermined pass-band region of said band-pass filter become approximately zero.

8. A parallel connection multi-stage band-pass filter as claimed in claim 1, wherein the phases of the respective resonant frequencies of the respective signals passing through said resonators, having neighboring resonant frequencies, are inverted with respect to each other.

9. A parallel connection multi-stage band-pass filter as claimed in claim 1, wherein said plurality of resonators comprises resonators respectively having maximum and minimum resonant frequencies and which have approximately the same first loaded Q;

said plurality of resonators is further comprised of additional resonators which have respective resonant frequencies intermediate to said maximum and minimum resonant frequencies and which are different from but close to each other; and each of said additional resonators has a loaded Q that is the same as or smaller than said first loaded Q.

* * * * *